(12) United States Patent
Licausi et al.

(10) Patent No.: US 9,887,127 B1
(45) Date of Patent: Feb. 6, 2018

(54) INTERCONNECTION LINES HAVING VARIABLE WIDTHS AND PARTIALLY SELF-ALIGNED CONTINUITY CUTS

(71) Applicant: GLOBALFOUNDRIES Inc., Grand Cayman (KY)

(72) Inventors: Nicholas Vincent Licausi, Watervliet, NY (US); Guillaume Bouche, Albany, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 15/379,740

(22) Filed: Dec. 15, 2016

(51) Int. Cl.
H01L 23/528 (2006.01)
H01L 21/768 (2006.01)
H01L 23/522 (2006.01)

(52) U.S. Cl.
CPC .. *H01L 21/76816* (2013.01); *H01L 21/76877* (2013.01); *H01L 23/5226* (2013.01); *H01L 23/5283* (2013.01); *H01L 23/5286* (2013.01)

(58) Field of Classification Search
None
See application file for complete search history.

(56) References Cited

U.S. PATENT DOCUMENTS

| 6,455,436 | B1 | 9/2002 | Ueda et al. |
|---|---|---|---|
| 7,183,142 | B2 | 2/2007 | Anderson et al. |
| 8,298,943 | B1 | 10/2012 | Arnold et al. |
| 8,518,824 | B2 | 8/2013 | Arnold et al. |
| 8,999,848 | B2 | 4/2015 | Lee et al. |
| 9,012,287 | B2 | 4/2015 | Liaw |
| 9,123,656 | B1 | 9/2015 | Hsieh et al. |
| 9,136,106 | B2 | 9/2015 | Wu et al. |
| 9,209,279 | B1 | 12/2015 | Zhang et al. |
| 9,406,775 | B1 | 8/2016 | Bouche et al. |
| 2005/0215040 | A1 | 9/2005 | Doyle |
| 2006/0055045 | A1* | 3/2006 | Park ............ G11C 5/025 257/758 |
| 2008/0193658 | A1 | 8/2008 | Millward |
| 2008/0227298 | A1 | 9/2008 | Hirota |
| 2011/0240596 | A1 | 10/2011 | Millward |

(Continued)

OTHER PUBLICATIONS

U.S. Appl. No. 15/077,384, filed Mar. 22, 2016.
(Continued)

Primary Examiner — Sitaramarao S Yechuri
(74) Attorney, Agent, or Firm — Heslin Rothenberg Farley & Mesiti P.C.

(57) ABSTRACT

A semiconductor cell includes a dielectric layer. An array of parallel metal lines is disposed in a longitudinal direction within the dielectric layer. The metal lines having line widths that are substantially equal to or greater than a predetermined minimum line width. Line spacers are disposed between the metal lines. The line spacers having line spacer widths that are substantially equal to or greater than a predetermined minimum line spacer width. The array of metal lines includes a signal line having a continuity cut disposed across its entire line width and a power line adjacent the signal line. The power line has a line width that is greater than twice the minimum line width. The power line has a notch disposed partially across its line width. The notch is aligned with the continuity cut in a direction perpendicular to the longitudinal direction of the metal lines.

8 Claims, 38 Drawing Sheets

(56) References Cited

U.S. PATENT DOCUMENTS

| | | |
|---|---|---|
| 2011/0256723 A1 | 10/2011 | Lee et al. |
| 2011/0316125 A1 | 12/2011 | Thomas |
| 2012/0118854 A1 | 5/2012 | Smayling et al. |
| 2012/0132988 A1 | 5/2012 | Lui et al. |
| 2013/0196517 A1* | 8/2013 | Tsujita .................. G03F 7/20 438/795 |
| 2013/0244344 A1 | 9/2013 | Malmhall et al. |
| 2013/0329486 A1 | 12/2013 | Juengling |
| 2014/0038428 A1 | 2/2014 | Huang et al. |
| 2014/0054534 A1 | 2/2014 | Pellizzer et al. |
| 2014/0170853 A1 | 6/2014 | Shamma et al. |
| 2014/0258961 A1 | 9/2014 | Ke et al. |
| 2014/0273363 A1 | 9/2014 | Chiu et al. |
| 2014/0273464 A1 | 9/2014 | Shieh et al. |
| 2015/0056800 A1 | 2/2015 | Mebarki et al. |
| 2015/0072527 A1 | 3/2015 | Ng et al. |
| 2015/0087149 A1 | 3/2015 | He et al. |
| 2015/0108087 A1* | 4/2015 | Somervell ............... G03F 7/42 216/47 |
| 2015/0140811 A1 | 5/2015 | Huang et al. |
| 2015/0147882 A1 | 5/2015 | Yao et al. |
| 2015/0179652 A1 | 6/2015 | Wang et al. |
| 2015/0243654 A1 | 8/2015 | Zhong et al. |
| 2015/0318173 A1 | 11/2015 | Shih et al. |
| 2015/0339422 A1 | 11/2015 | Greco et al. |
| 2016/0049307 A1 | 2/2016 | Chen |
| 2016/0056075 A1 | 2/2016 | Wei et al. |
| 2016/0056104 A1 | 2/2016 | Bouche et al. |
| 2016/0064248 A1 | 3/2016 | Lee et al. |
| 2016/0086841 A1 | 3/2016 | Song et al. |
| 2016/0099178 A1 | 4/2016 | Zhana et al. |
| 2016/0225634 A1 | 8/2016 | Anderson et al. |
| 2016/0254191 A1 | 9/2016 | Tseng et al. |
| 2017/0221702 A1 | 8/2017 | Lee et al. |

OTHER PUBLICATIONS

U.S. Appl. No. 15/271,475, filed Sep. 21, 2016.
U.S. Appl. No. 15/271,497, filed Sep. 21, 2016.
U.S. Appl. No. 15/141,087, filed Apr. 28, 2016.
U.S. Appl. No. 15/379,605, filed Dec. 15, 2016.
U.S. Appl. No. 15/379,645, filed Dec. 15, 2016.
U.S. Appl. No. 15/379,707, filed Dec. 15, 2016.
U.S. Appl. No. 15/362,035, filed Nov. 28, 2016.
U.S. Appl. No. 15/271,519, filed Sep. 21, 2016.
U.S. Appl. No. 15/053,818, filed Feb. 25, 2016.
U.S. Appl. No. 15/077,480, filed Mar. 22, 2016.
U.S. Appl. No. 15/077,564, filed Mar. 22, 2016.

* cited by examiner

INTERCONNECTION LINES HAVING VARIABLE WIDTHS AND PARTIALLY SELF-ALIGNED CONTINUITY CUTS

TECHNICAL FIELD

The present invention relates to semiconductor devices and methods of fabricating the same. More specifically, the invention relates to a method and apparatus of forming interconnection metal lines having variable pitch and variable line widths for a semiconductor structure.

BACKGROUND

Self-aligned multiple patterning (SAMP) techniques (such as self-aligned double patterning (SADP) or self-aligned quadruple patterning (SAQP)) are currently used in ultra-high density integrated circuits to provide an electrical interconnection system which includes multiple arrays of parallel metal lines disposed in several levels of dielectric layers. The dielectric layers are typically interconnected through a system of metalized vias. Conventionally, within an array of metal lines, the direction longitudinal, or parallel, to the metal lines is designated the "Y" direction and the direction perpendicular, or lateral, to the metal lines is designated the "X" direction.

However, formation of interconnect systems having large arrays of multiple parallel metal lines in a Back-End-Of-Line (BEOL) process flow for a semiconductor fabrication often require the metal lines to have both variable pitch and variable line widths. This kind of variability in both pitch and line width is very difficult to achieve with a conventional SAMP process. This is particularly the case when the pitch (i.e., the minimum distance between repetitive features in a semiconductor device structure) is less than or equal to 38 nm.

Typically, an interconnect system located in the back end, or BEOL portion, of a semiconductor structure will be composed of many cells of repetitive arrays of lines, wherein the overall height of each cell (i.e., the overall X direction distance across the cell) is an integer multiple of a minimum pitch, or track. The track (or minimum pitch) being equal to the minimum functionally allowable line width (in the X direction) plus the minimum space (in the X direction) between the lines. For example, a five track cell in an interconnection system where the minimum pitch is 36 nm would have an overall height that is five times 36 nm, for a total of 180 nm. By way of another example, a six track cell having a minimum pitch of 28 nm would have an overall height of six times 28 nm, for a total of 168 nm.

However, within those cells, different lines will have different functions and, therefore, will require different line widths. For example, power lines within a typical cell are primarily used to deliver power to devices (such as transistors) in a semiconductor structure and signal lines within that same cell are used to carry signals to and from the semiconductor devices. Since the power lines must carry much more current than the signal lines, the power lines must be significantly wider than the signal lines and therefore require a larger pitch. This type of variability is difficult to achieve in a conventional SAMP process.

Additionally, if the spaces between metal lines in a cell of a semiconductor interconnect system become too narrow due to, for example, lithographic variability, those unacceptably small spaces can lead to time delayed shorting between the lines. Time delayed shorting, or Time Delayed Dielectric Breakdown (TDDB), can occur when the spaces between lines become so small that the dielectric isolating material between the lines becomes stressed over an extended period of time by the electric fields being generated between the lines.

Additionally, in order to provide functionality between devices, such as transistors, capacitors and the like, in the integrated circuit, a plurality of continuity cuts (also referred to as continuity blocks) must be lithographically patterned into the signal lines and power lines of the cells at specific locations to direct current flow between the dielectric layers and the devices. Problematically however, lithographic misalignment, or overlay, is a significant issue at lower technology node sizes, such as when the technology class size is no greater than 10 nm or when the repetitive pitch distance is no greater than 38 nm. Overlay is a measure of how well two lithographic layers (or steps) align. Overlay can be in the X or Y direction and is expressed in units of length.

The lithographically disposed continuity cuts must be large enough to make sure that they cut the signal line or power line they are supposed to without clipping any neighboring lines, taking into account worst case overlay tolerance conditions. However, for a pitch of 38 nm or less, the current state of the art overlay control is not precise enough to prevent continuity cuts from over-extending into neighboring lines. The unwanted over-extension of continuity cuts into neighboring lines can, in the worst case condition, completely interrupt electrical continuity in the wrong line.

Additionally, a line that is inadvertently only partially cut (or notched) may still conduct for a time, but may over heat and prematurely fail over time. This inadvertent cutting and/or notching is particularly problematic for signal lines, which are much smaller in horizontal width than power lines.

Accordingly, there is a need for an apparatus, and method of forming the same, of cells of an interconnect system for a semiconductor structure, wherein the spaces between lines within the cell are not subject to lithographic variability. Additionally, there is a need for the lines within the cells to be variable in width and variable in pitch. There is a need, specifically, for such variable line widths and pitches where the cells have a track (or minimum pitch between lines) of 38 nm or less.

Additionally, there is a need for a method of patterning continuity cuts (or continuity blocks) within signal lines and power lines of the cells that are tolerant of lithographic misalignment. More specifically, there is a need for a method that is capable of patterning continuity cuts into the signal lines and power lines of the cells such that the cuts at least do not inadvertently fully cut any of the neighboring lines and do not notch any of the neighboring signal lines.

BRIEF DESCRIPTION

The present invention offers advantages and alternatives over the prior art by providing an apparatus, and method of making the same, of a cell of metal lines for an interconnect system of a semiconductor structure. The metal lines are separated by spacers that are not subject to lithographic variation and, therefore, can be very accurately controlled even with a minimum line pitches of 38 nm or less. Additionally, the widths of the metal lines are variable.

Moreover the method, in accordance with the present invention, patterns continuity cuts within signal lines and power lines of the cells that are tolerant of lithographic misalignment. More specifically, the method is capable of patterning continuity cuts into the signal lines and power lines of the cells such that the cuts do not inadvertently fully cut any of the neighboring lines and do not notch any of the neighboring signal lines. Only the power lines may include notches that cut 20 percent through the power line's width or less.

A semiconductor cell in accordance with one or more aspects of the present invention includes a dielectric layer composed of a dielectric isolation material. An array of substantially parallel metal lines is disposed in a longitudinal direction within the dielectric layer. The metal lines have line widths that are substantially equal to or greater than a predetermined minimum line width. Line spacers are disposed between the metal lines and have the dielectric isolation material of the dielectric layer disposed therein. The line spacers have line spacer widths that are substantially equal to or greater than a predetermined minimum line spacer width adequate to provide electrical isolation between the metal lines. The array of metal lines includes a signal line having a continuity cut disposed across its entire line width and a power line adjacent the signal line. The power line has a line width that is greater than twice the minimum line width. The power line has a notch disposed partially across its line width. The notch is aligned with the continuity cut in a direction substantially perpendicular to the longitudinal direction of the metal lines.

In another aspect of the present invention a method includes patterning an array of $1^{st}$ mandrels into a $1^{st}$ mandrel layer of a semiconductor structure, the $1^{st}$ mandrels having a $1^{st}$ mandrel width, spacing and pitch. First mandrel spacers are formed on sidewalls of the $1^{st}$ mandrels. An array of $2^{nd}$ mandrels are patterned into a $2^{nd}$ mandrel layer of the semiconductor structure, the $2^{nd}$ mandrels having a $2^{nd}$ mandrel width smaller than the $1^{st}$ mandrel width, and a $2^{nd}$ mandrel pitch substantially equal to the $1^{st}$ mandrel pitch. The $2^{nd}$ mandrels entirely overlay the $1^{st}$ mandrels such that a pair of portions of the $1^{st}$ mandrels extend beyond opposing sidewalls of the $2^{nd}$ mandrels to form an A line extension and a C line extension of the $1^{st}$ mandrels. Second mandrel spacers are formed on sidewalls of the $2^{nd}$ mandrels. An array of metal lines is formed separated by line spacers in a dielectric layer of the semiconductor structure. The line spacers are formed from the $1^{st}$ and $2^{nd}$ mandrel spacers. The metal lines have widths formed from at least one of the $1^{st}$ mandrel spacing, A and C line extensions, and $2^{nd}$ mandrel width.

DRAWINGS

The invention will be more fully understood from the following detailed description taken in conjunction with the accompanying drawings, in which.

Figure 1A:
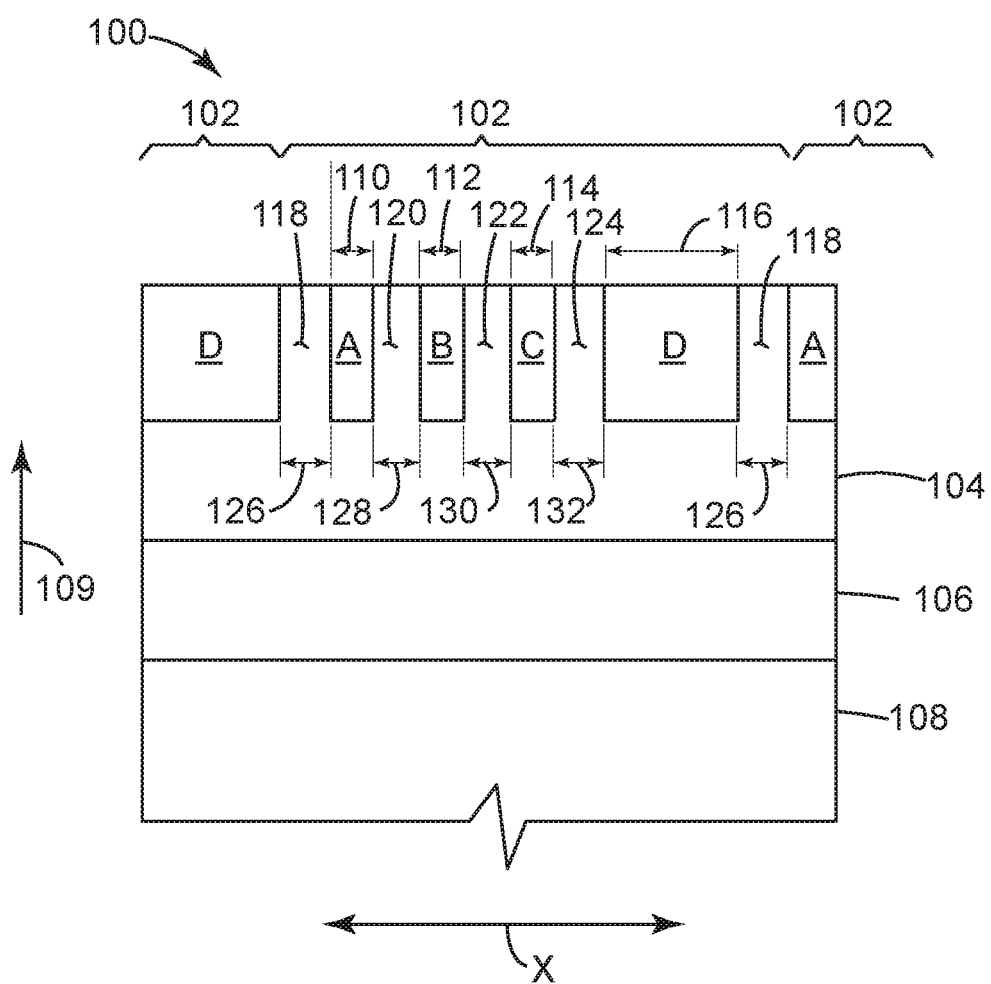
FIG. 1A is a cross-sectional side view of an exemplary embodiment of a semiconductor structure of an integrated circuit having a metal interconnect cell of signal lines A, B and C and a power line D in accordance with the present invention.
Figure 1B:
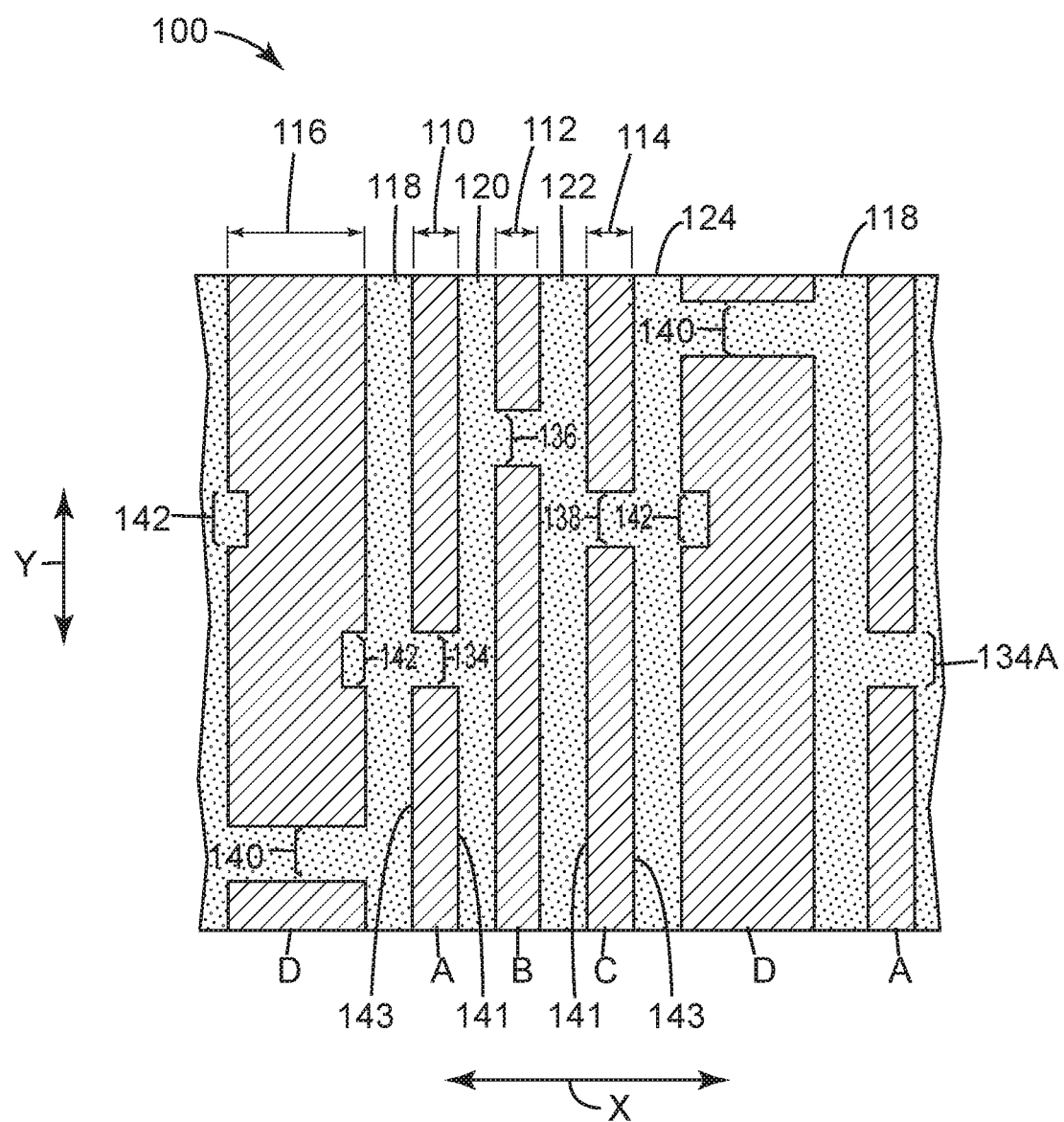
FIG. 1B is a top view of the structure of FIG. 1A showing the signal lines A, B, C and power line D with associated continuity cuts in those lines in accordance with the present invention.
Figure 2:
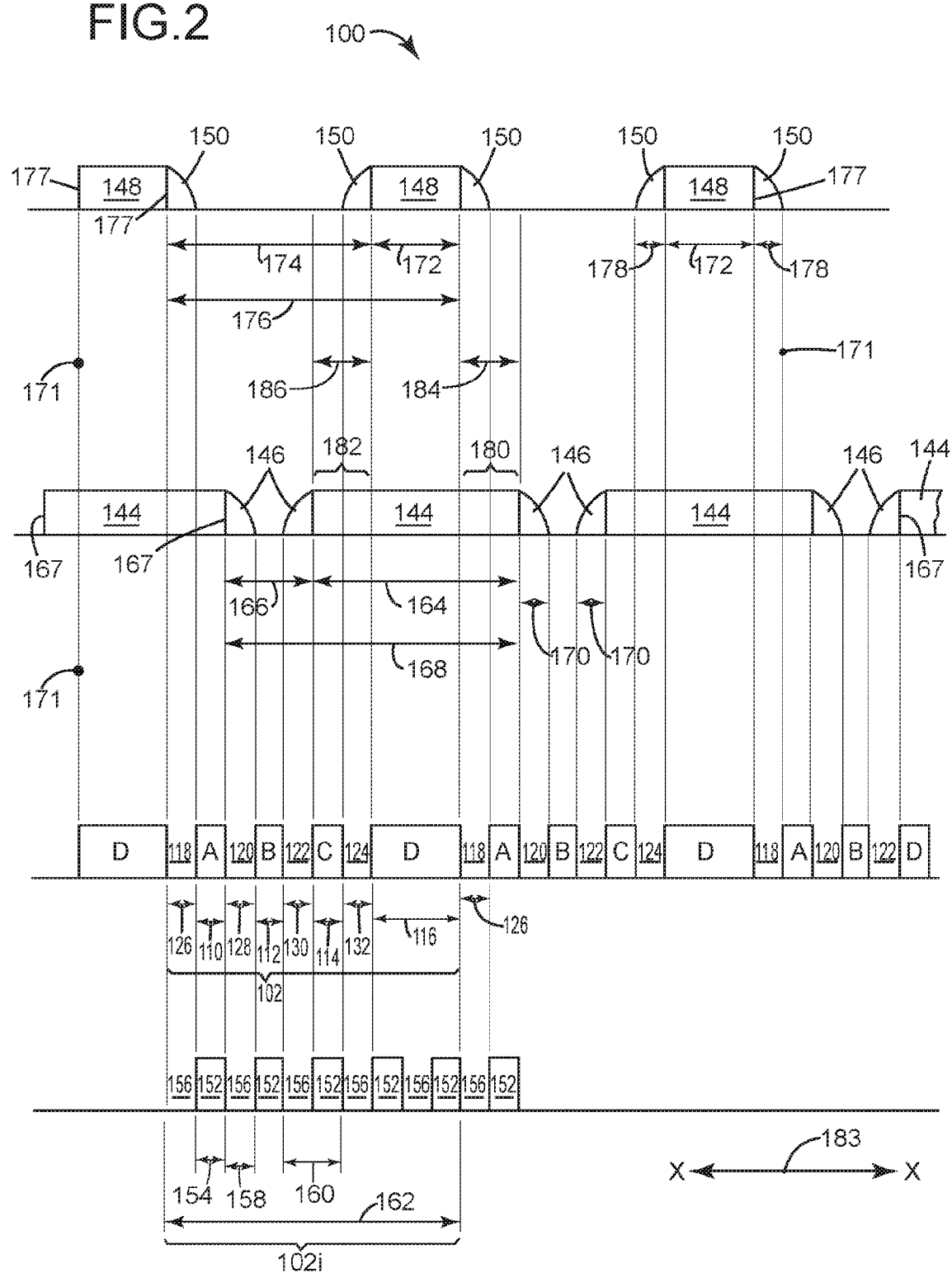
Figure 3:
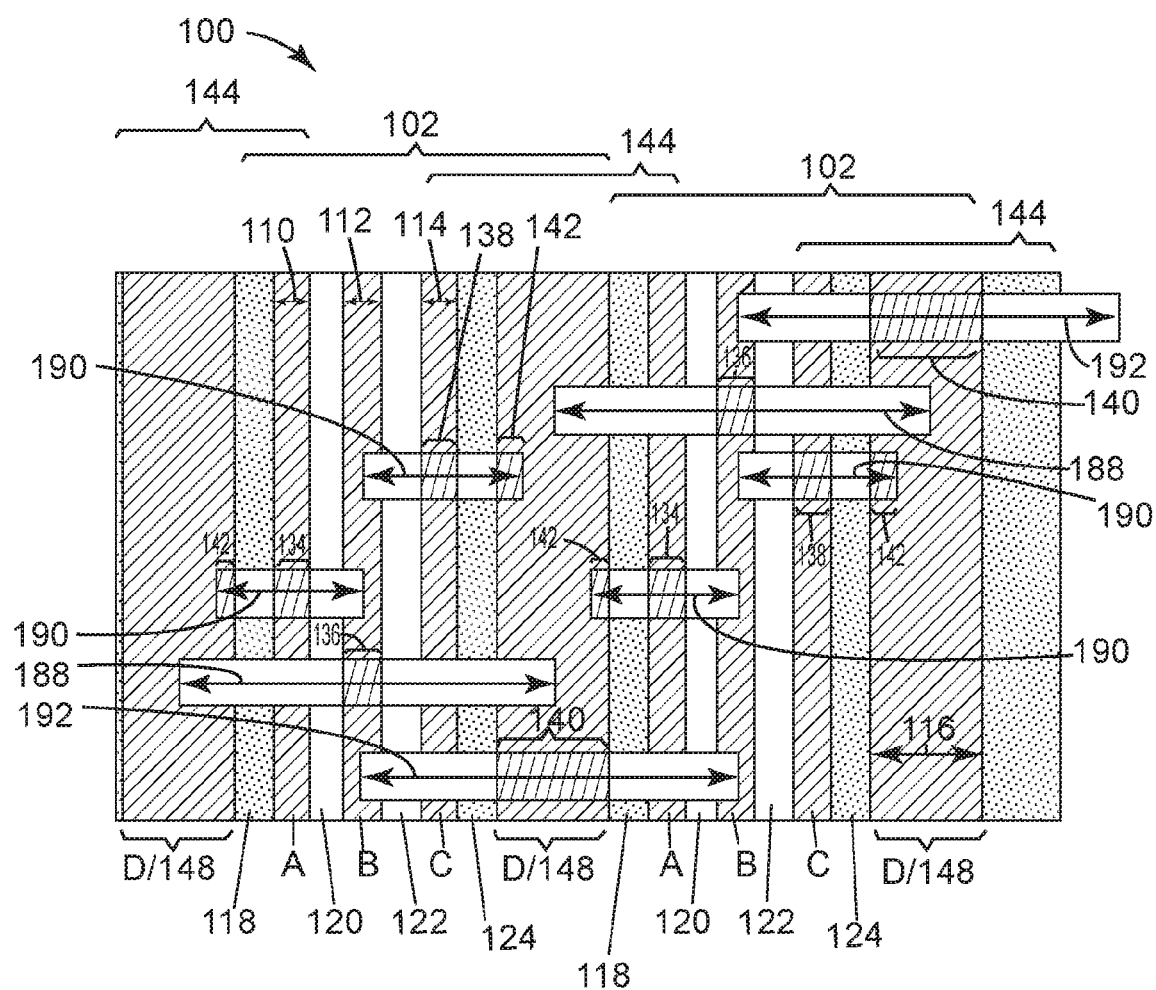
Figure 4:
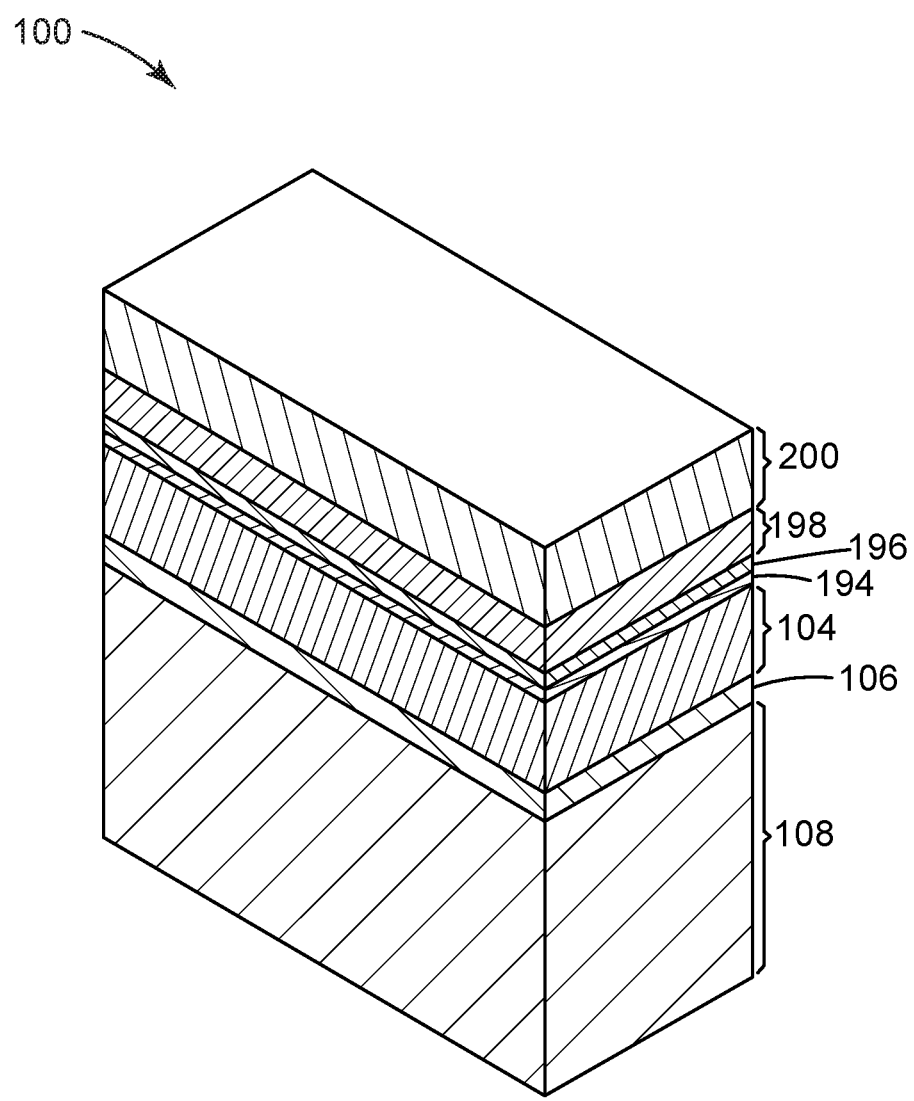
Figure 5:
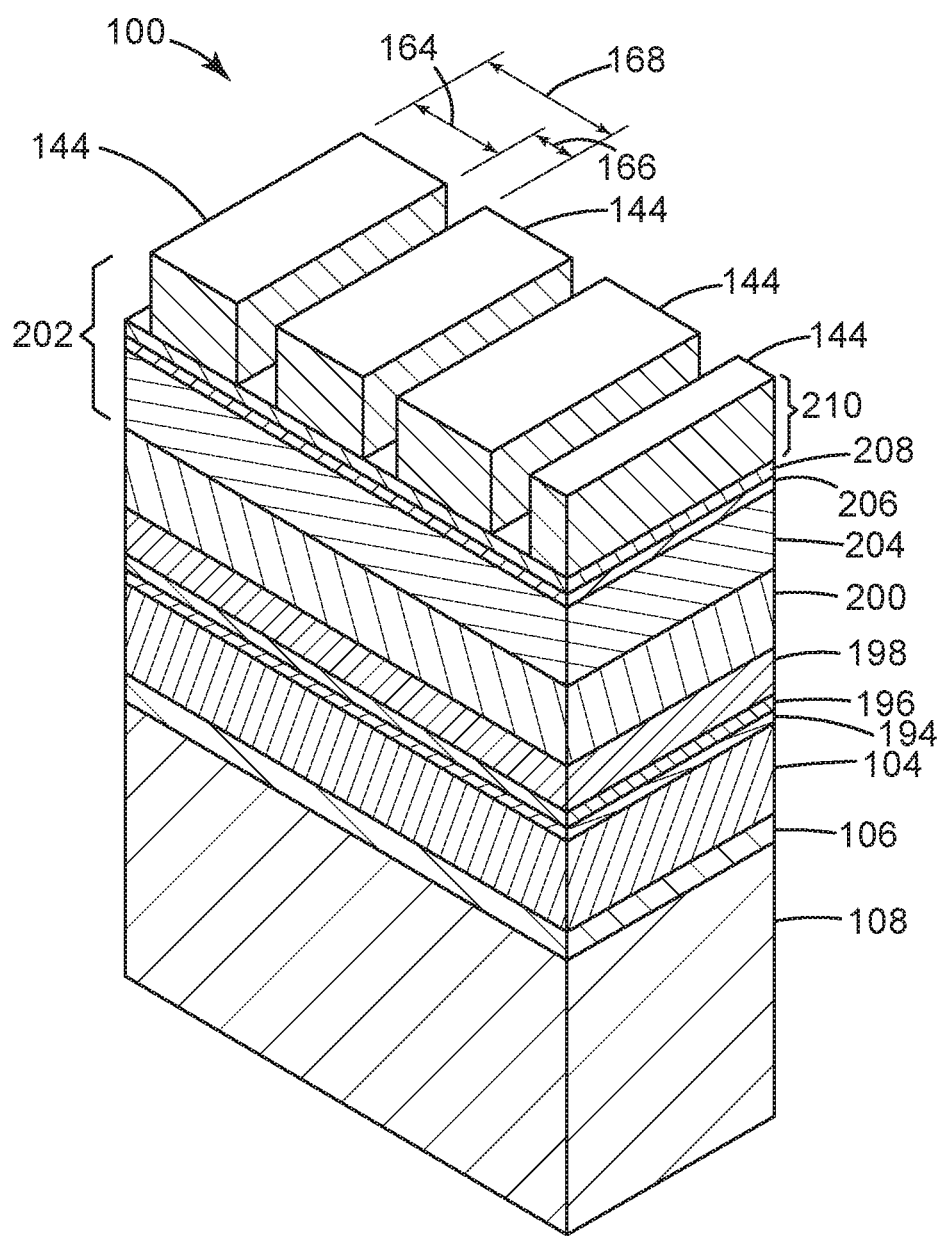
Figure 6:
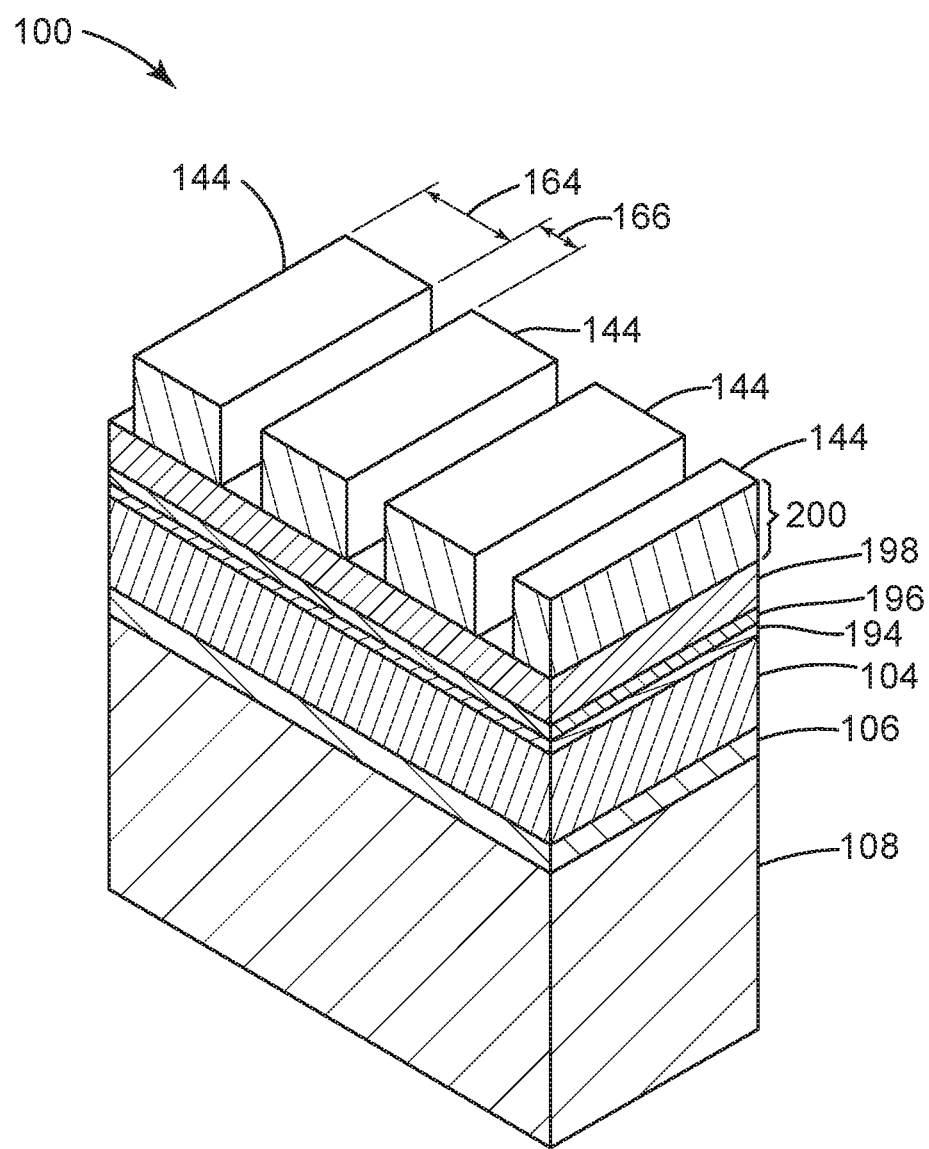
Figure 7A:
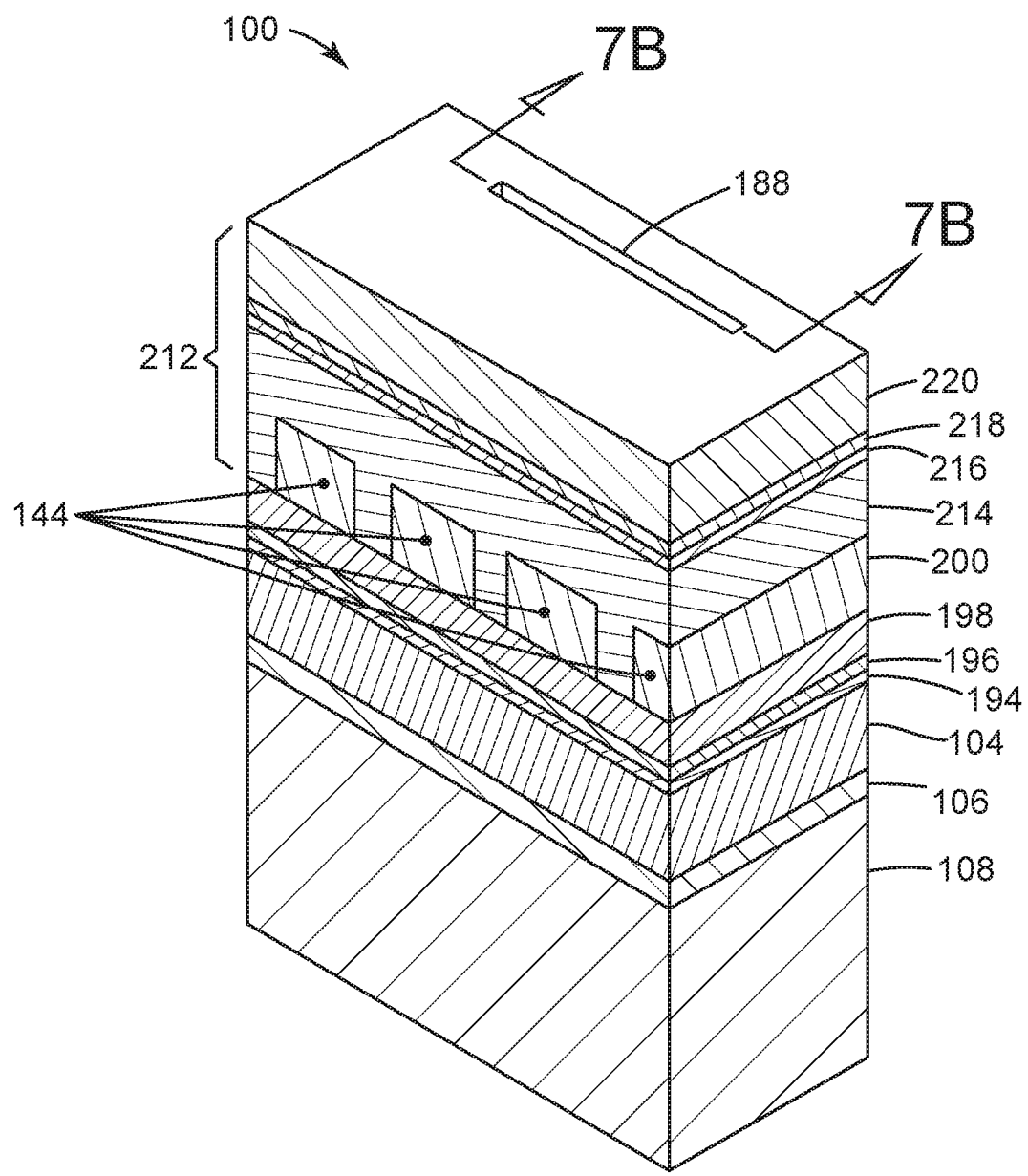
Figure 7B:
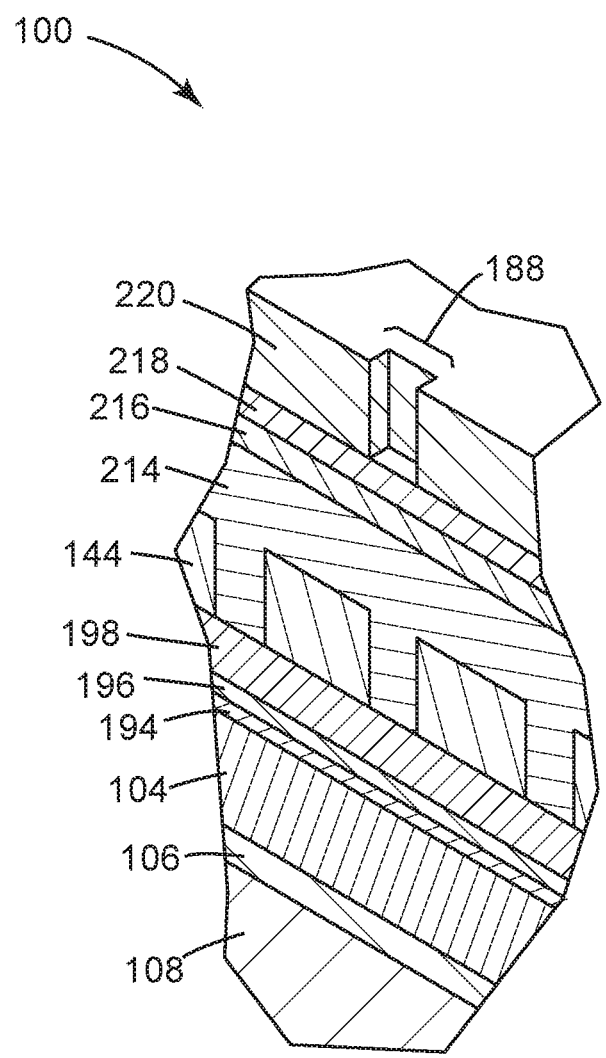
Figure 8:
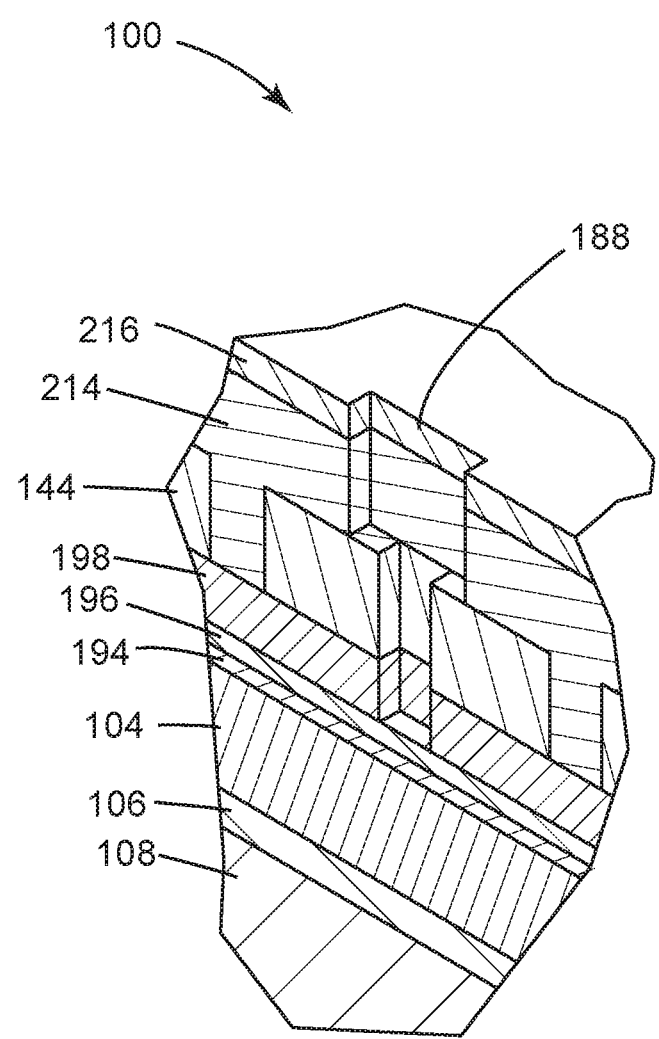
Figure 9:
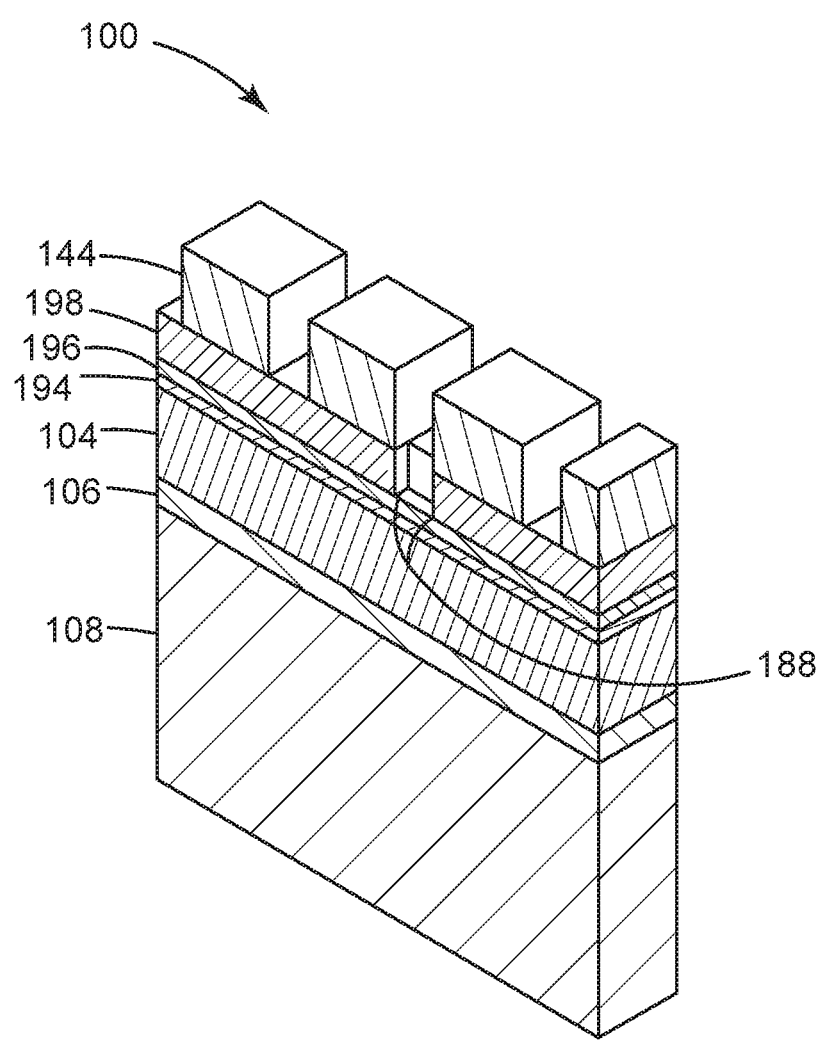
Figure 10A:
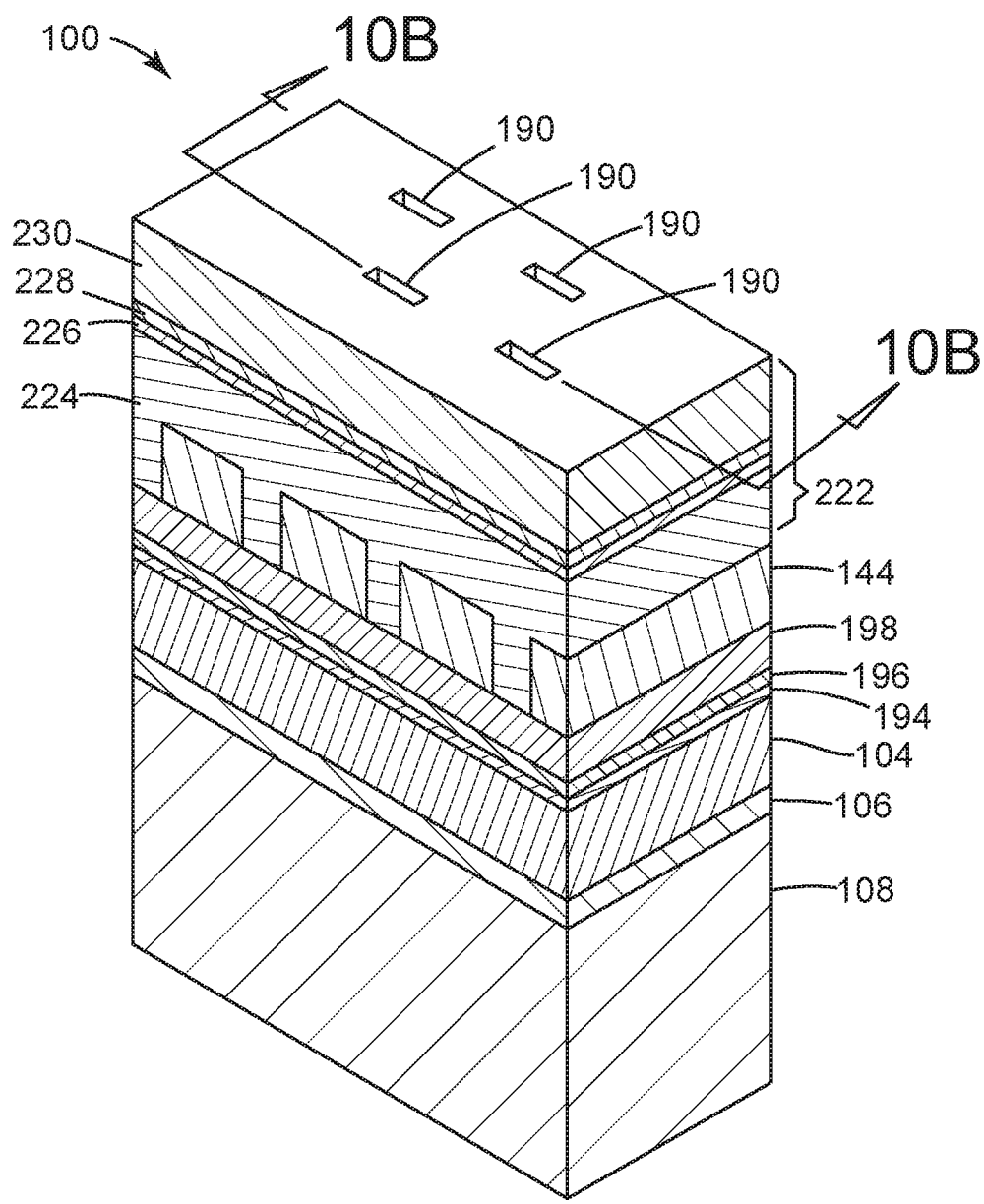
Figure 10B:
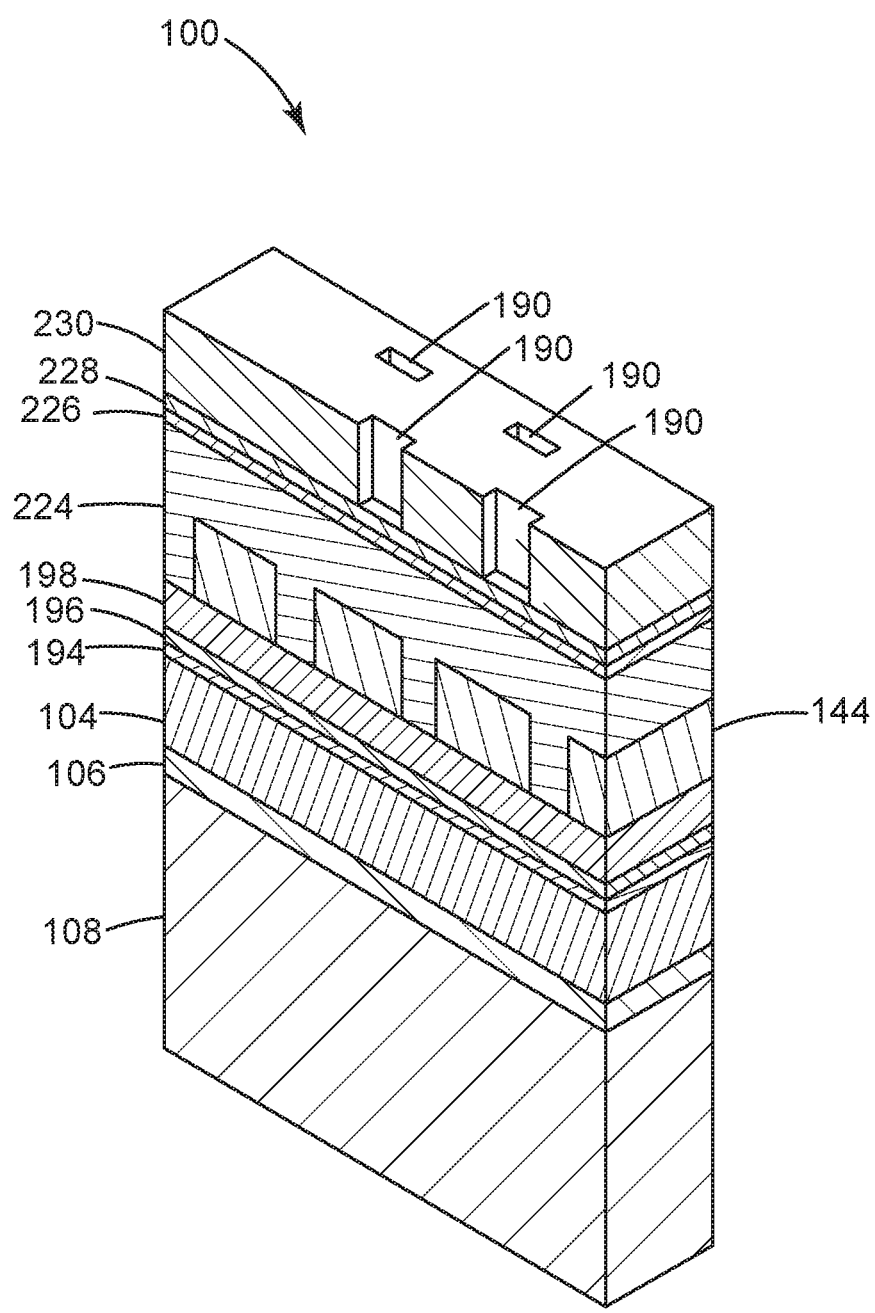
Figure 11:
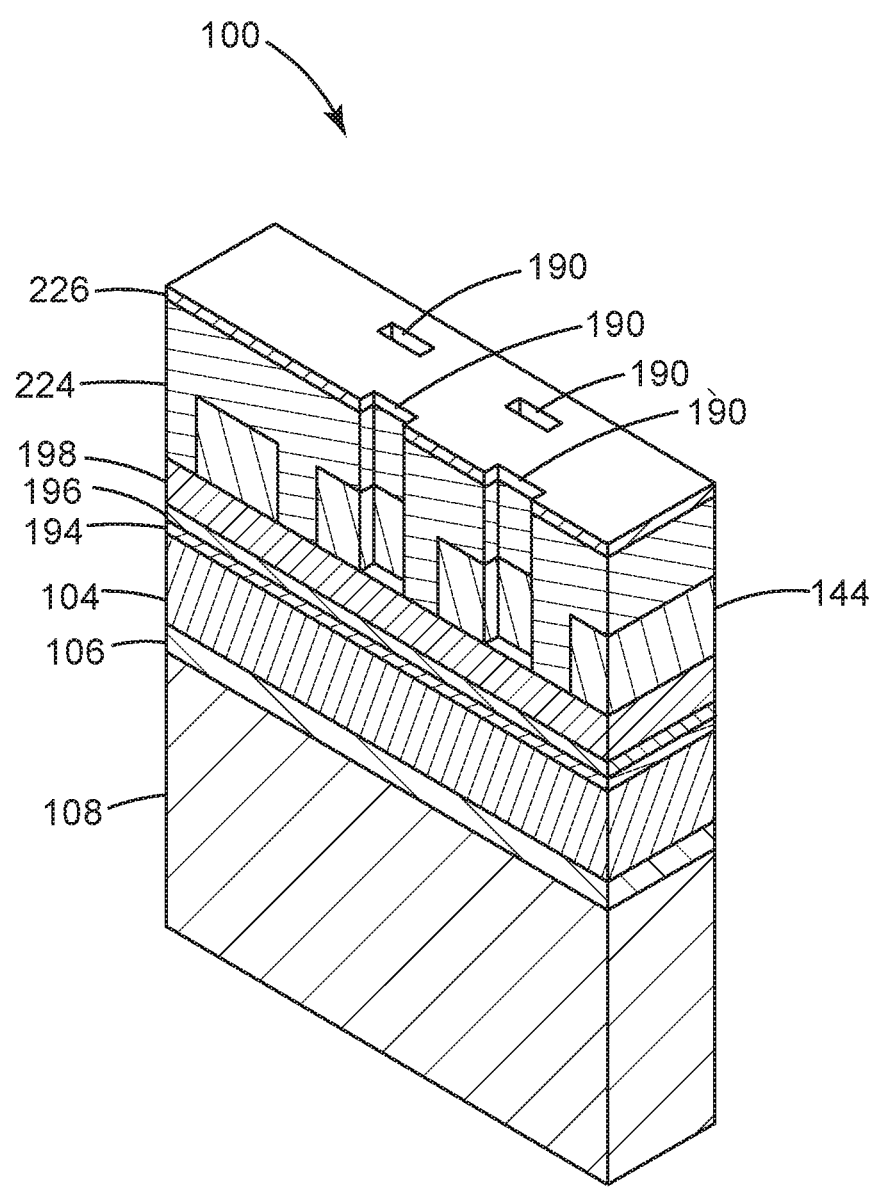
Figure 12:
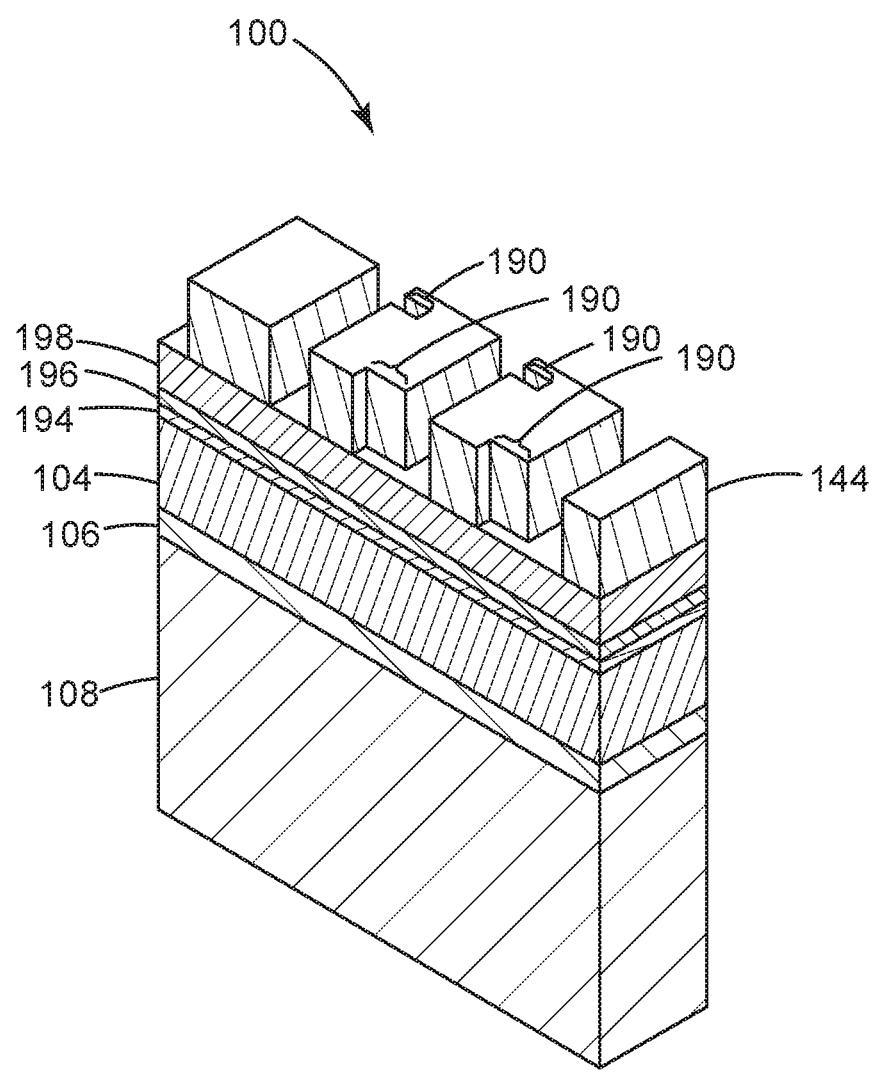
Figure 13A:
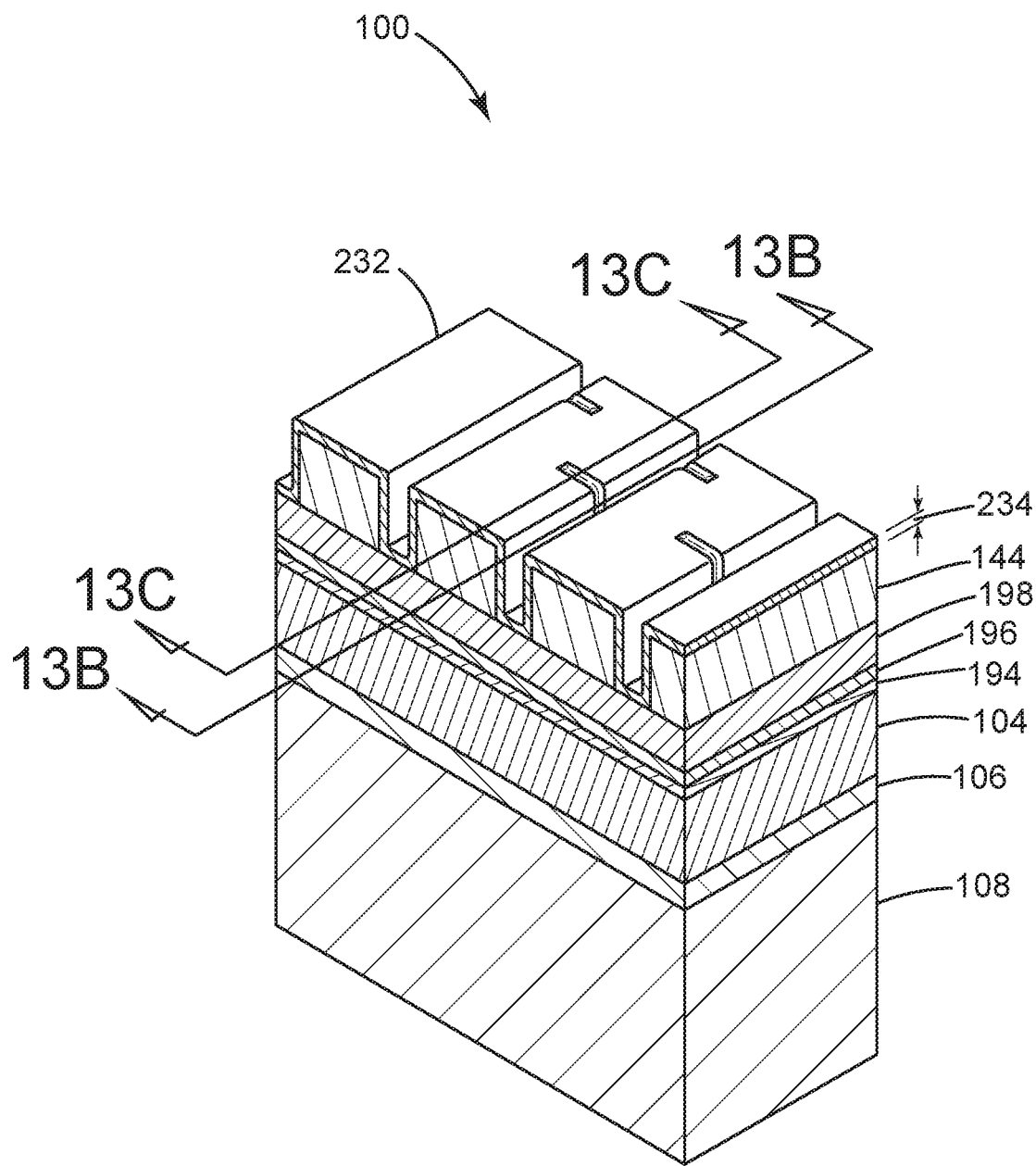
Figure 13B:
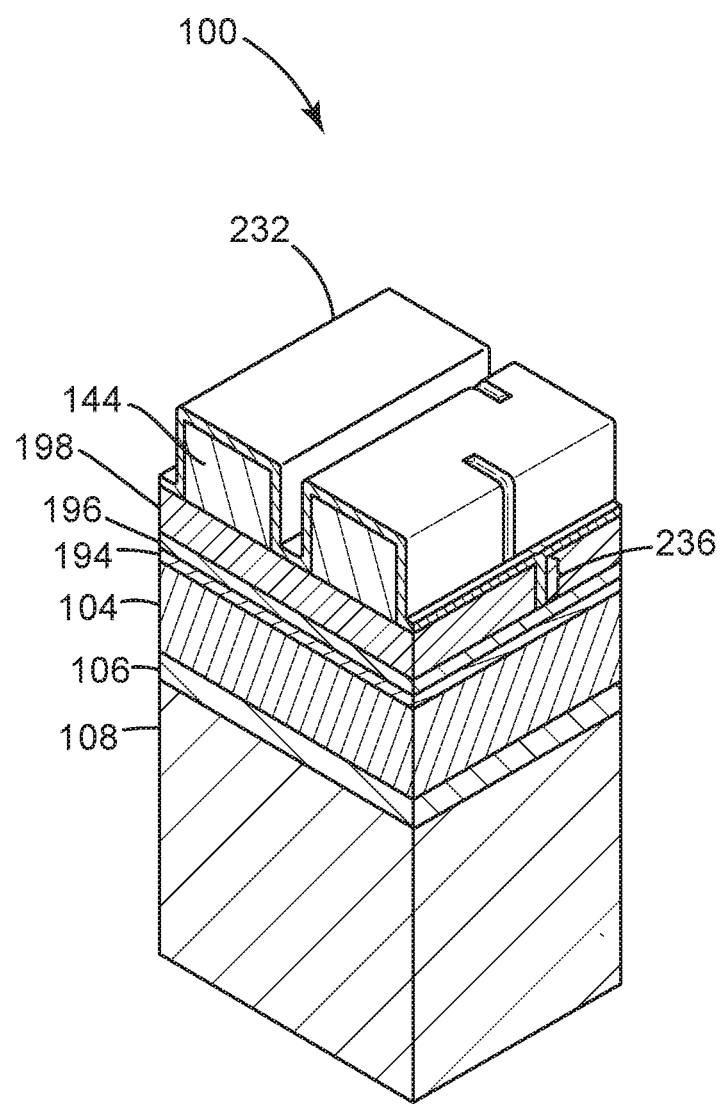
Figure 13C:
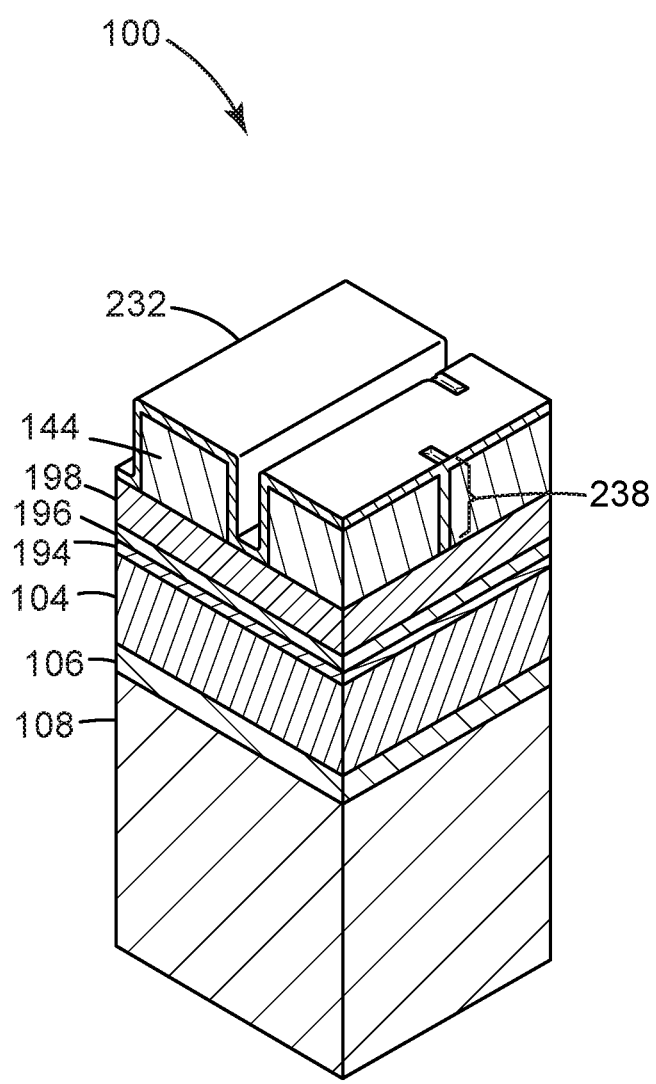
Figure 14:
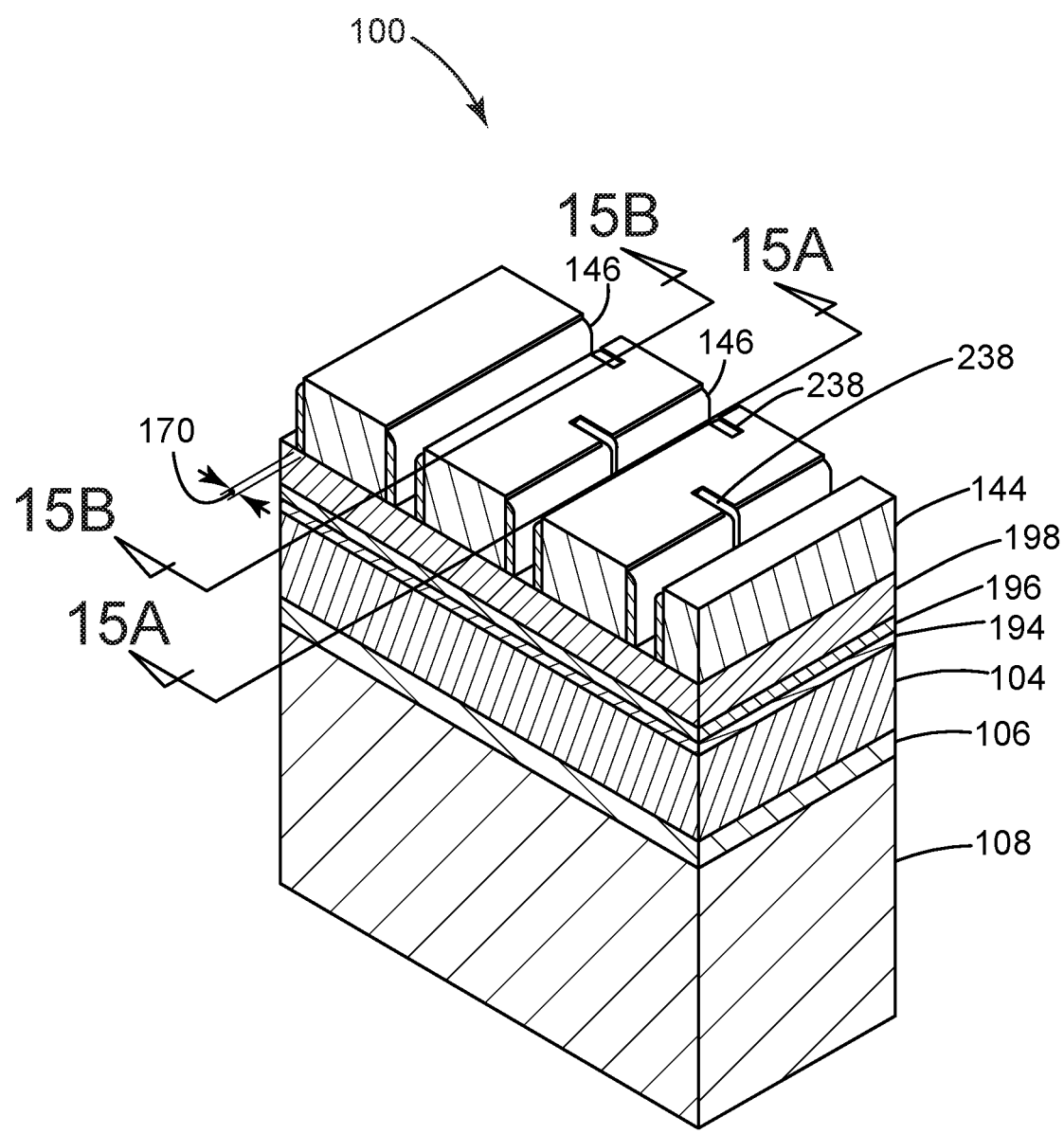
Figure 15A:
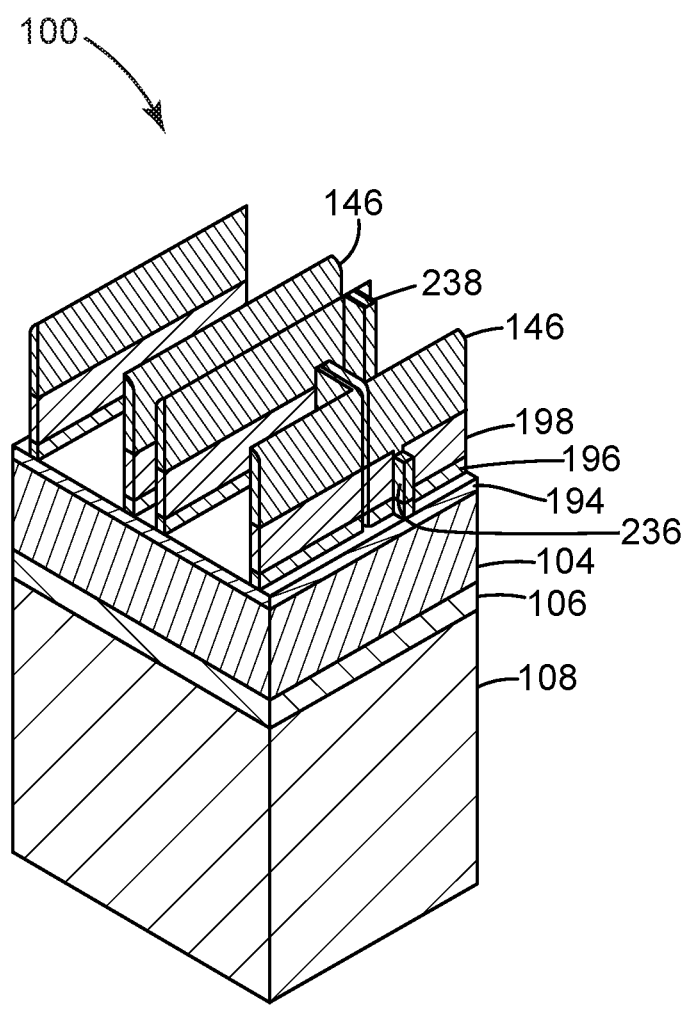

FIG. 2 is a cross sectional view of a plurality of the cells of FIG. 1A superimposed over an imaginary 5 track minimum pitch cell, a plurality of yet to be formed first mandrels and their associated $1^{st}$ mandrel spacers superimposed over the cells of FIG. 1A, and a plurality of yet to be formed $2^{nd}$ mandrels and their associated $2^{nd}$ mandrel spacers superimposed over the $1^{st}$ mandrels in accordance with the present invention;

FIG. 3 is a top view of the plurality of cells of FIG. 1B having the yet to be formed $1^{st}$ mandrels and $2^{nd}$ mandrels superimposed thereon, and having yet to be formed $1^{st}$, $2^{nd}$ and $3^{rd}$ openings also superimposed thereon in accordance with the present invention;

FIG. 4 is a perspective view of an exemplary embodiment of the semiconductor structure of FIG. 1A at an intermediate stage of manufacturing, wherein the structure is composed of a stack of layers including (from top to bottom) a $1^{st}$ mandrel layer, $3^{rd}$, $2^{nd}$ and $1^{st}$ hardmask layers, a dielectric layer, an etch stop layer and buried layers in accordance with the present invention;

FIG. 5 is a perspective view of the structure of FIG. 4 with a first lithographic stack disposed thereon and $1^{st}$ mandrels patterned into a resist layer of the $1^{st}$ lithographic stack in accordance with the present invention;

FIG. 6 is a perspective view the structure of FIG. 5 having the first mandrels patterned into the $1^{st}$ mandrel layer in accordance with the present invention;

FIG. 7A is a perspective view of the structure of FIG. 6 having a $2^{nd}$ lithographic stack disposed thereon and $1^{st}$ openings patterned into a resist layer of the $2^{nd}$ lithographic stack in accordance with the present invention;

FIG. 7B is a cross sectional perspective view of FIG. 7A taken along the line 7B-7B in accordance with the present invention;

FIG. 8 is a perspective view of the structure of FIG. 7A having the $1^{st}$ openings etched down past the $1^{st}$ mandrels and through the $3^{rd}$ hardmask layer to land on the $2^{nd}$ hardmask layer;

FIG. 9 is a perspective view of the structure of FIG. 8 having the $2^{nd}$ lithographic stack stripped off of the structure in accordance with the present invention;

FIG. 10A is a perspective view of the structure of FIG. 9 having a $3^{rd}$ lithographic stack disposed thereon and $2^{nd}$ openings patterned into a resist layer of the $3^{rd}$ lithographic stack in accordance with the present invention;

FIG. 10B is a cross-sectional perspective view of FIG. 10A taken along the line 10B-10B in accordance with the present invention;

FIG. 11 is a perspective view of the structure of FIG. 10 B having the $2^{nd}$ openings etched into the $1^{st}$ mandrels in accordance with the present invention;

FIG. 12 is a perspective view of the structure of FIG. 11 having the $3^{rd}$ lithographic stack removed in accordance with the present invention;

FIG. 13A is a perspective view of the structure of FIG. 12 having a $1^{st}$ mandrel spacer layer disposed thereon in accordance with the present invention;

FIG. 13B is a cross sectional perspective view of FIG. 13A taken along the line 13B-13B in accordance with the present invention;

FIG. 13C is a cross sectional perspective view of FIG. 13A taken along the line 13C-13C in accordance with the present invention;

FIG. 14 is a perspective view of the structure of FIG. 13A having the first mandrel spacer layer anisotropically etched to form $1^{st}$ mandrel spacers in accordance with the present invention;

FIG. 15A is a cross sectional perspective view of FIG. 14 taken along the line 15A-15A after the $1^{st}$ mandrels have been pulled and pattern transferred into underlying films.

Figure 15B:
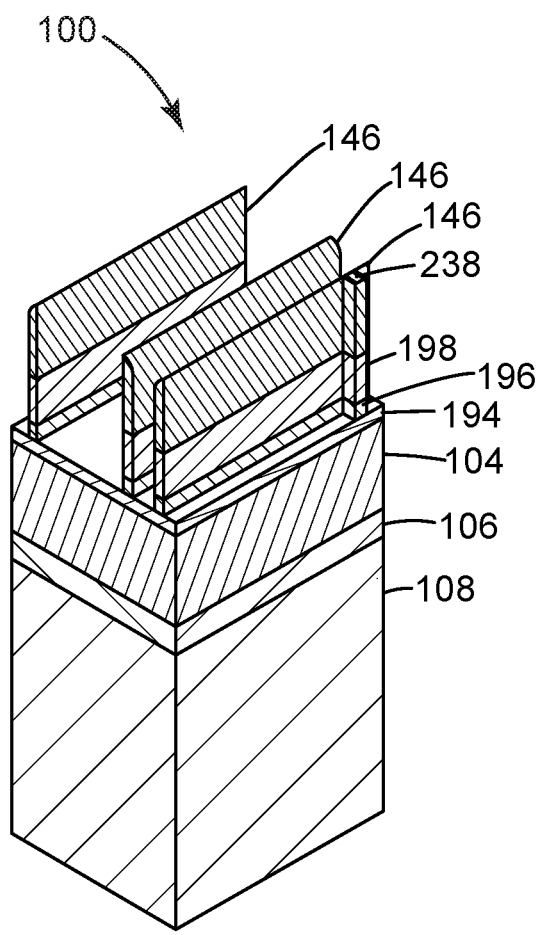

FIG. 15B is a cross sectional perspective view of FIG. 14 taken along the lines 15B-15B after the 1st mandrel has been pulled and pattern transferred into underlying films.

Figure 16:
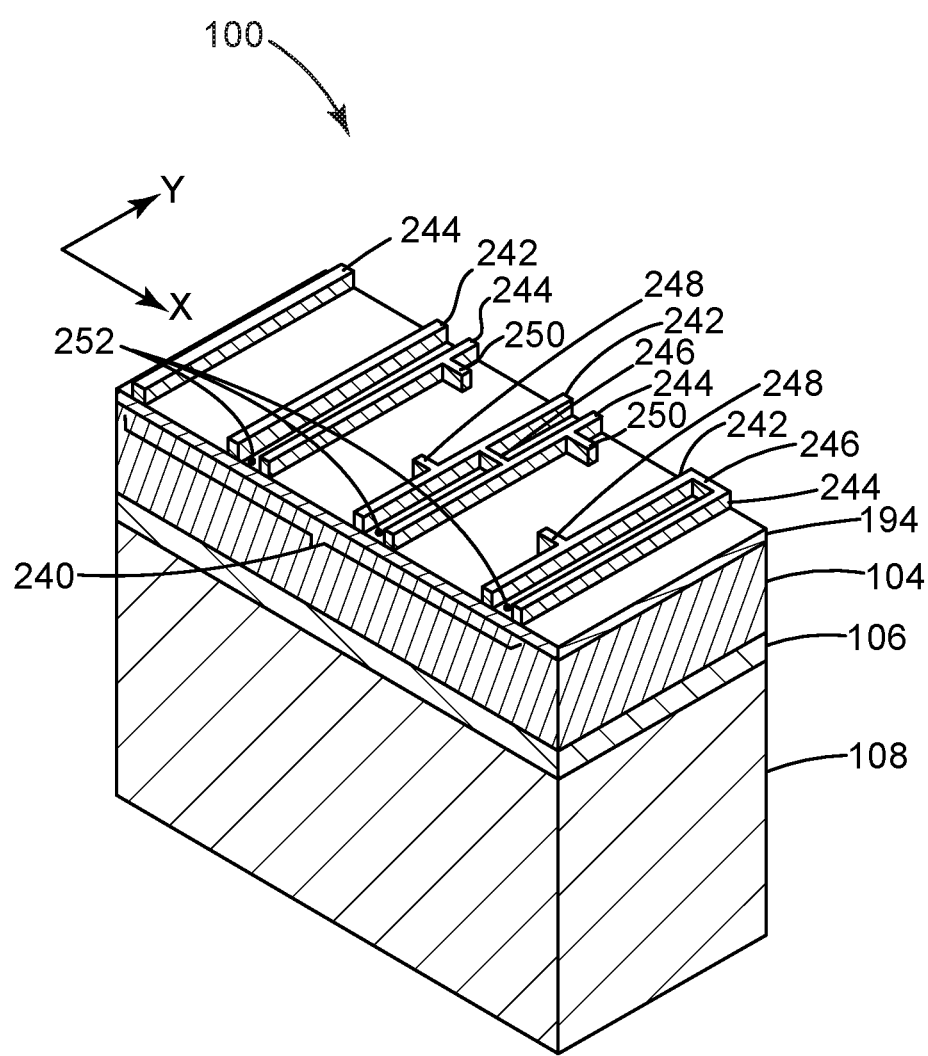
Figure 17:
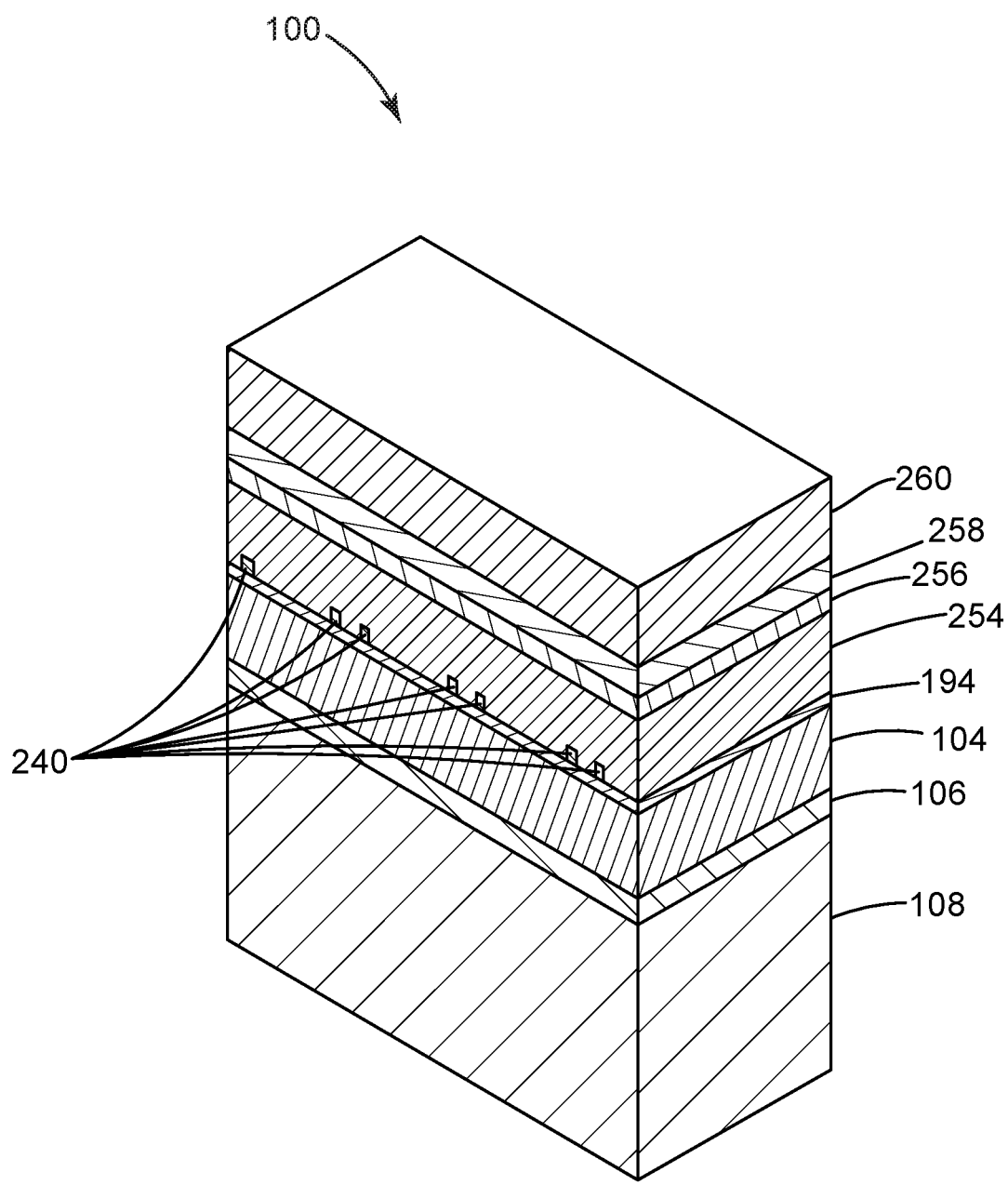
Figure 18:
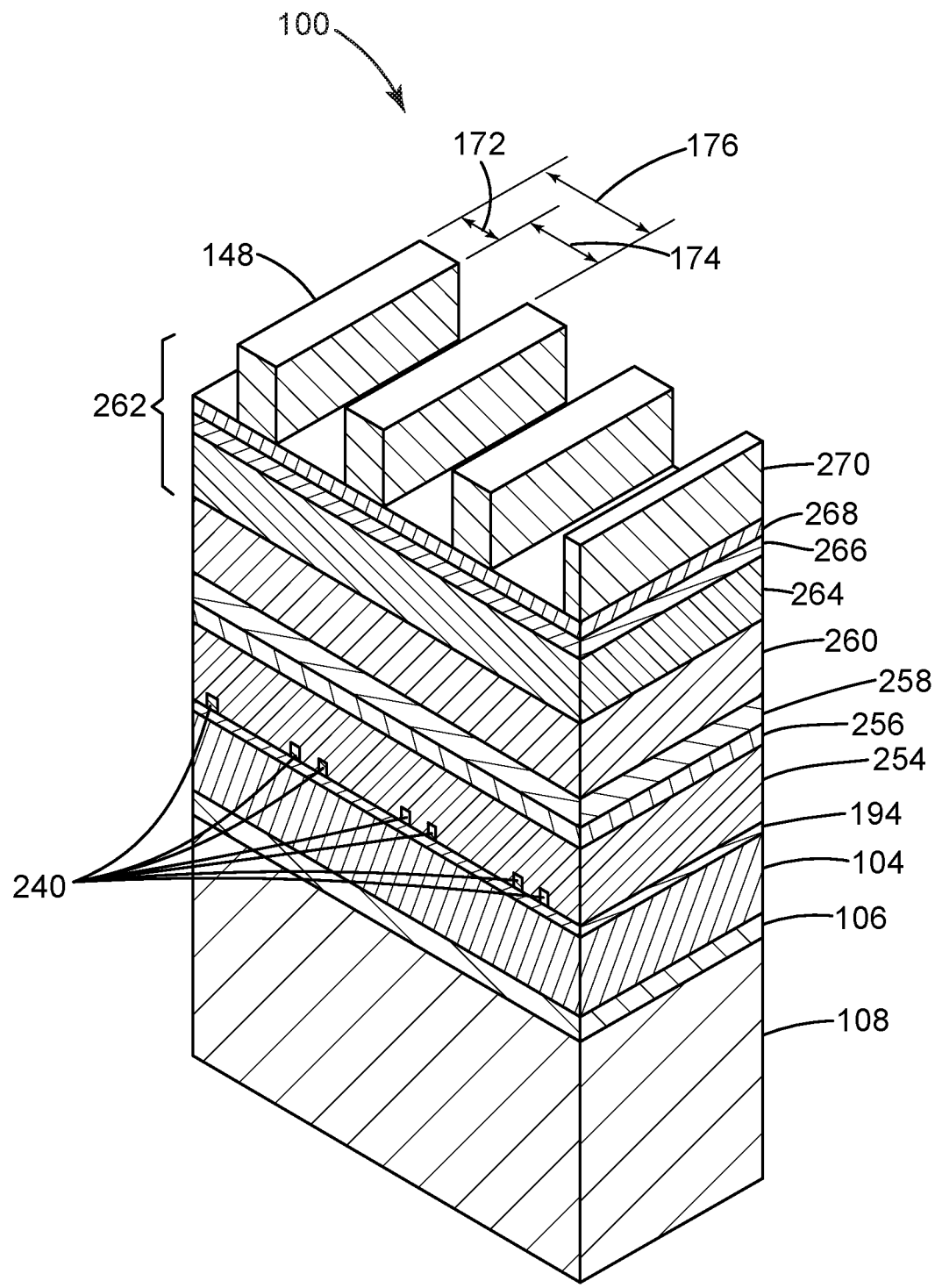
Figure 19:
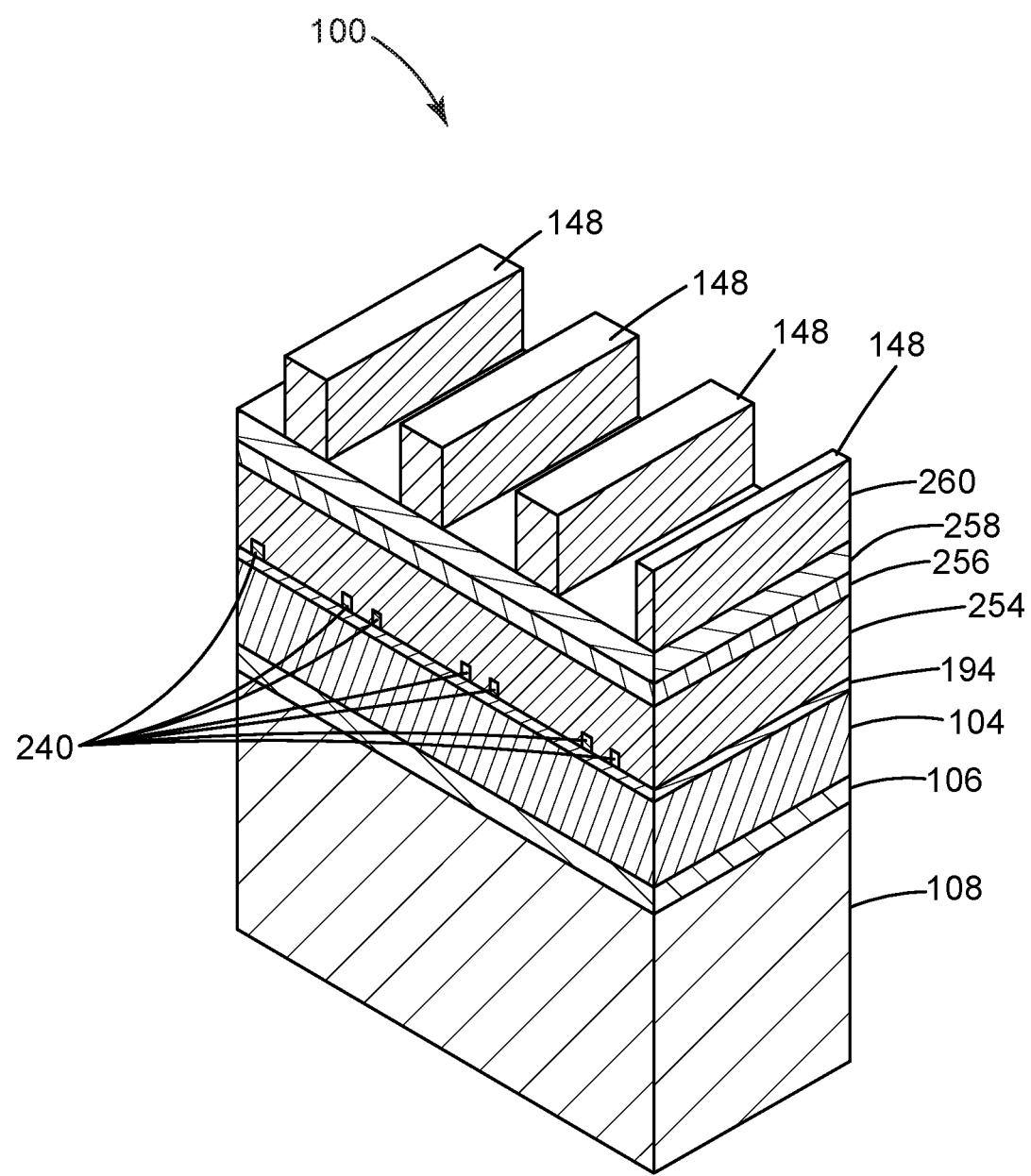
Figure 20A:
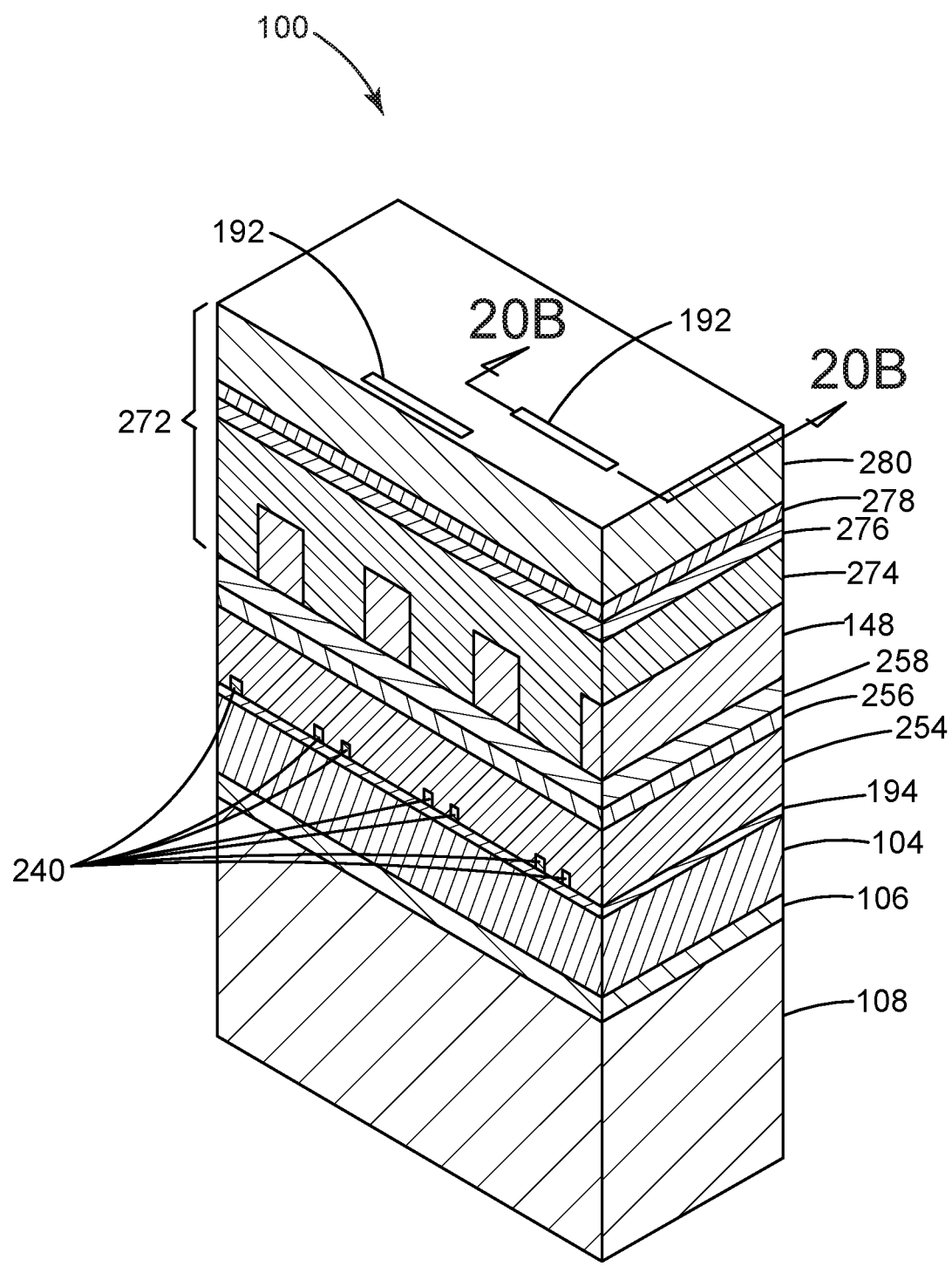
Figure 20B:
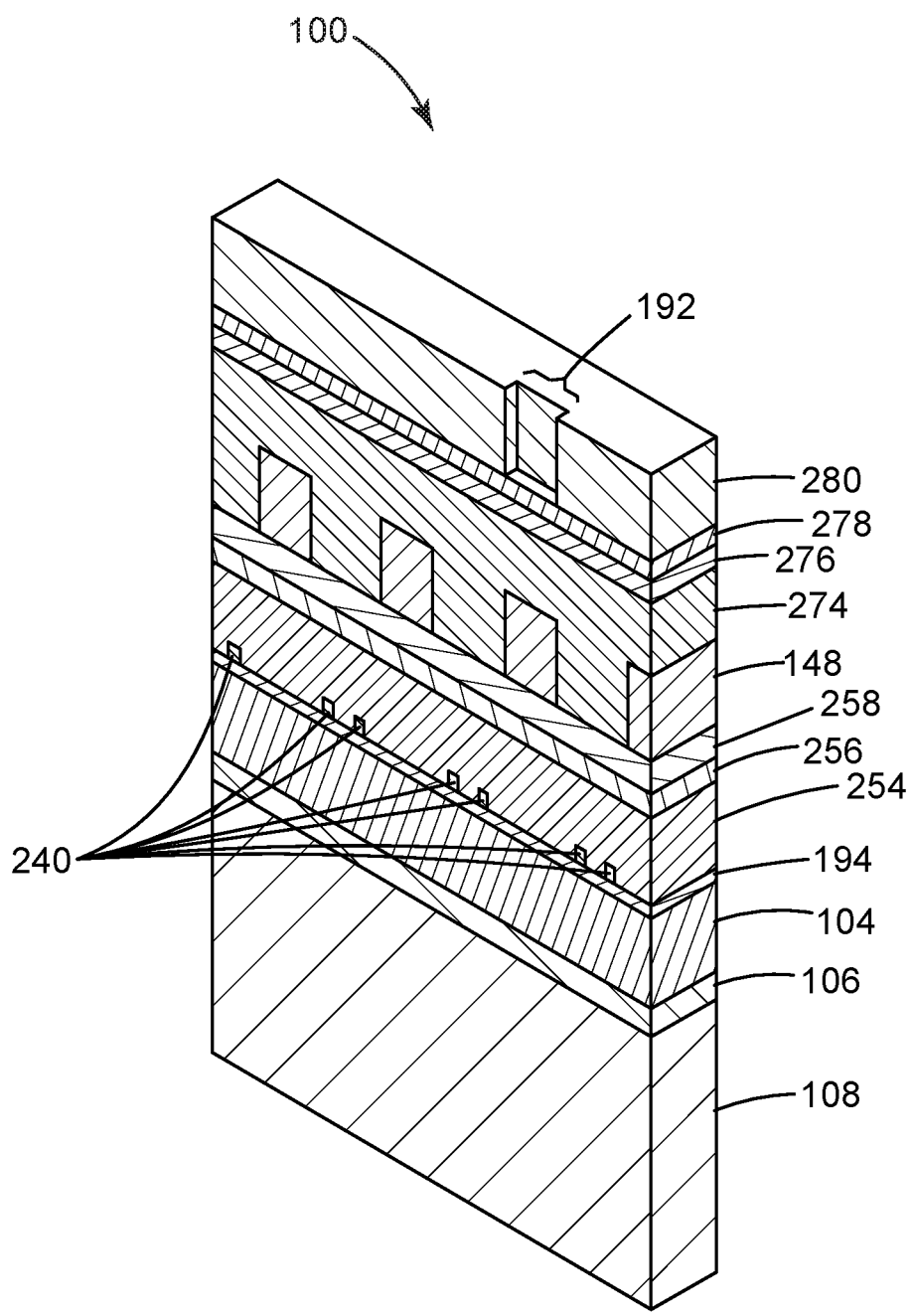
Figure 21:
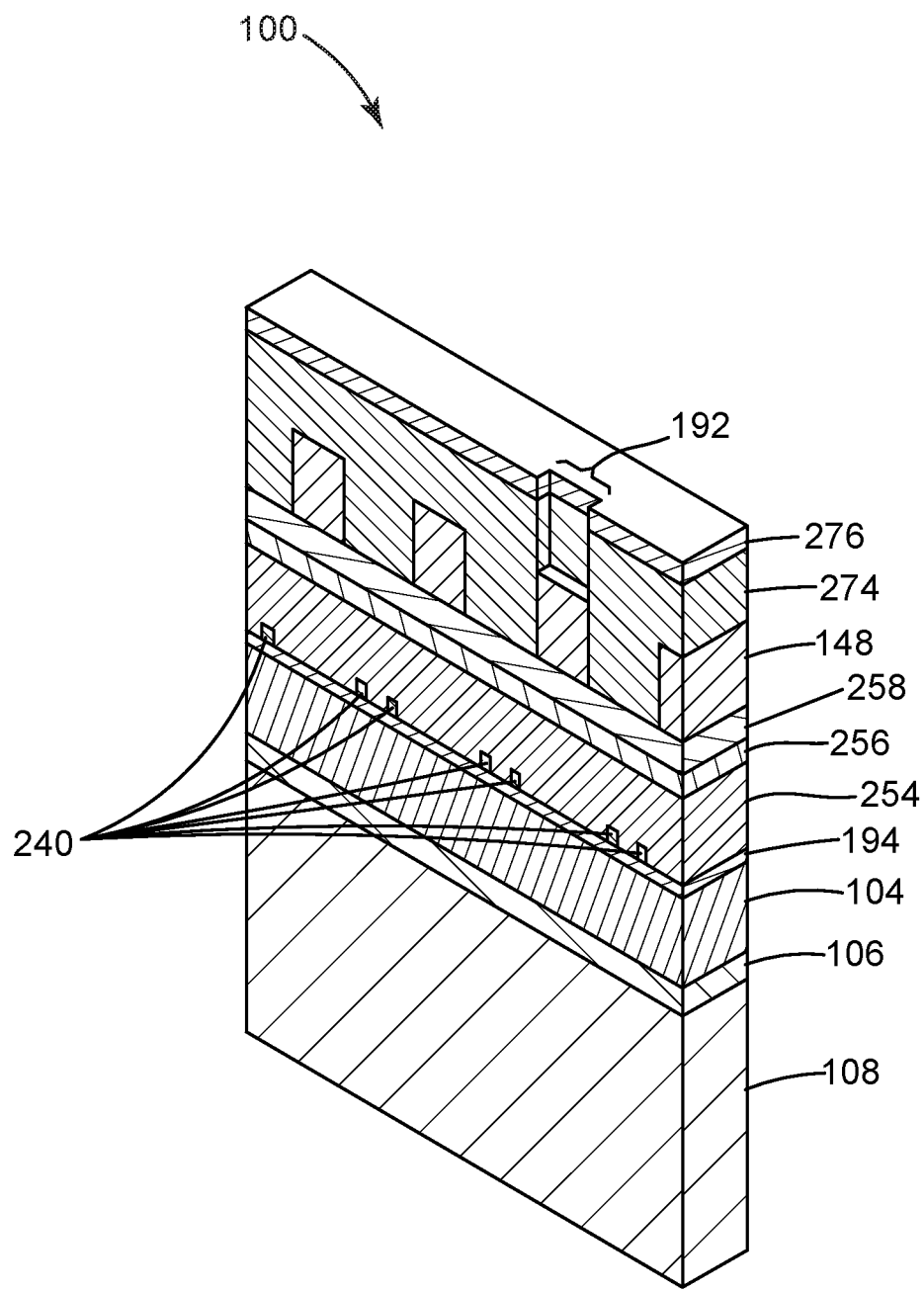
Figure 22:
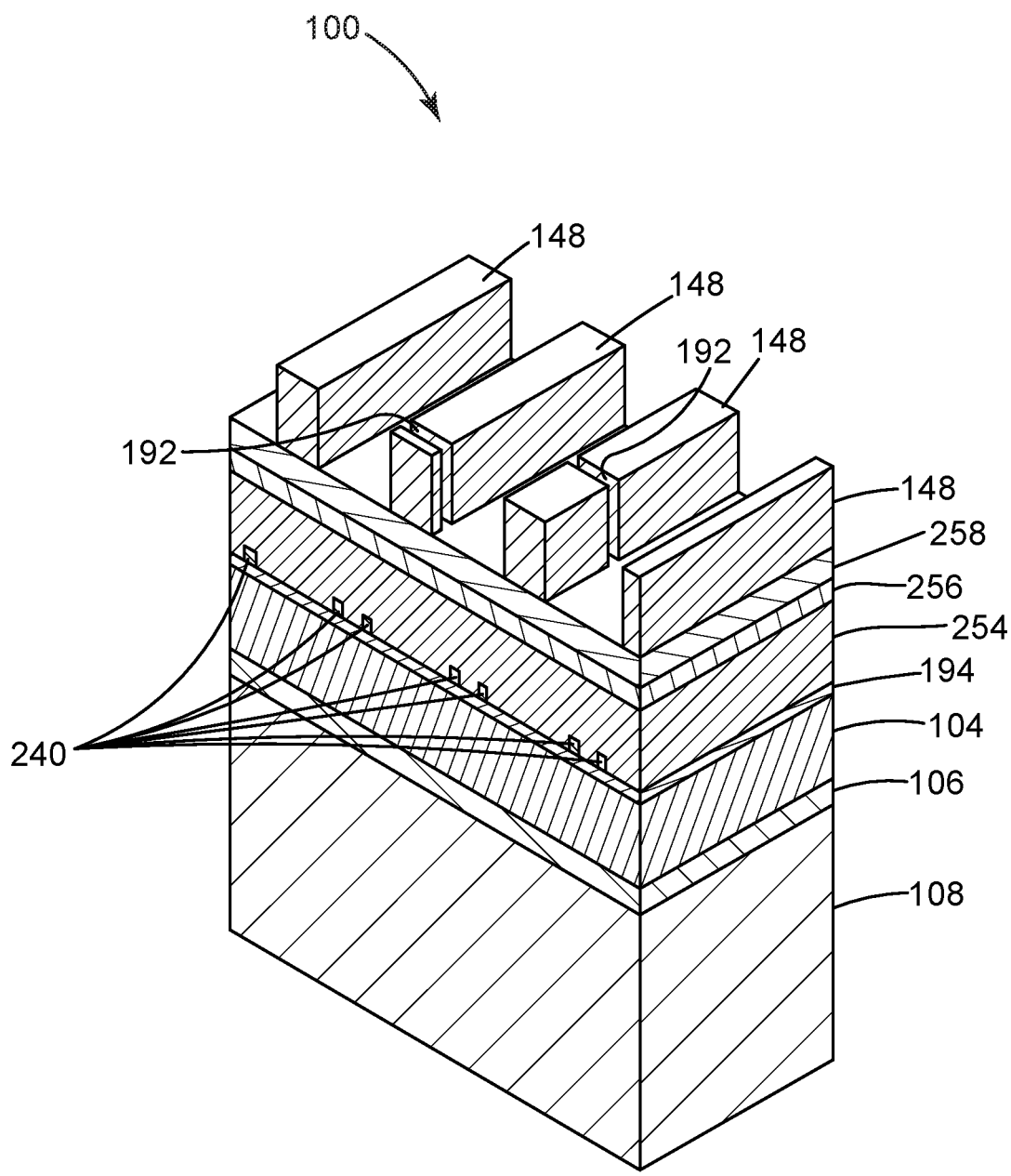
Figure 23:
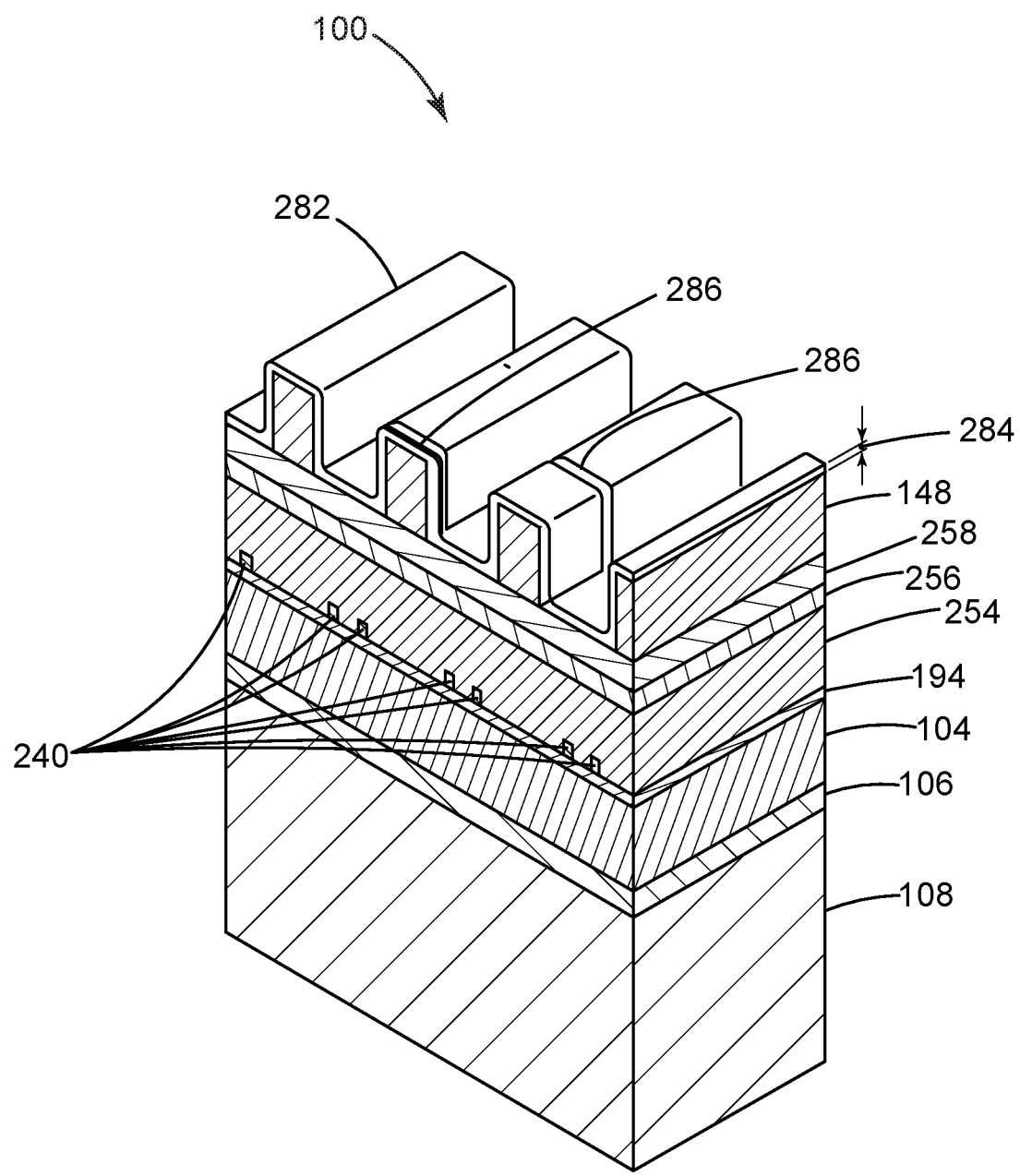
Figure 24:
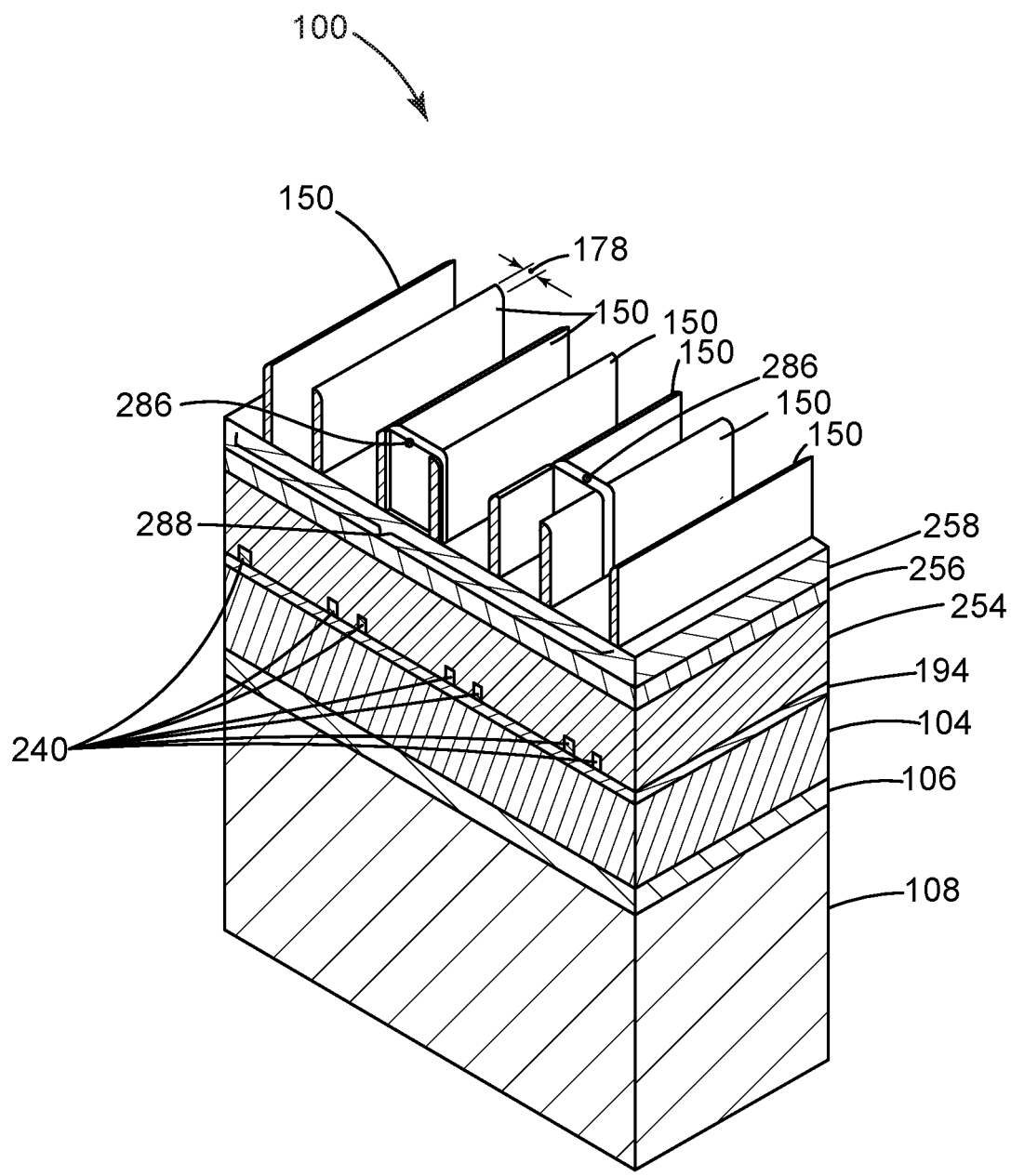
Figure 25:
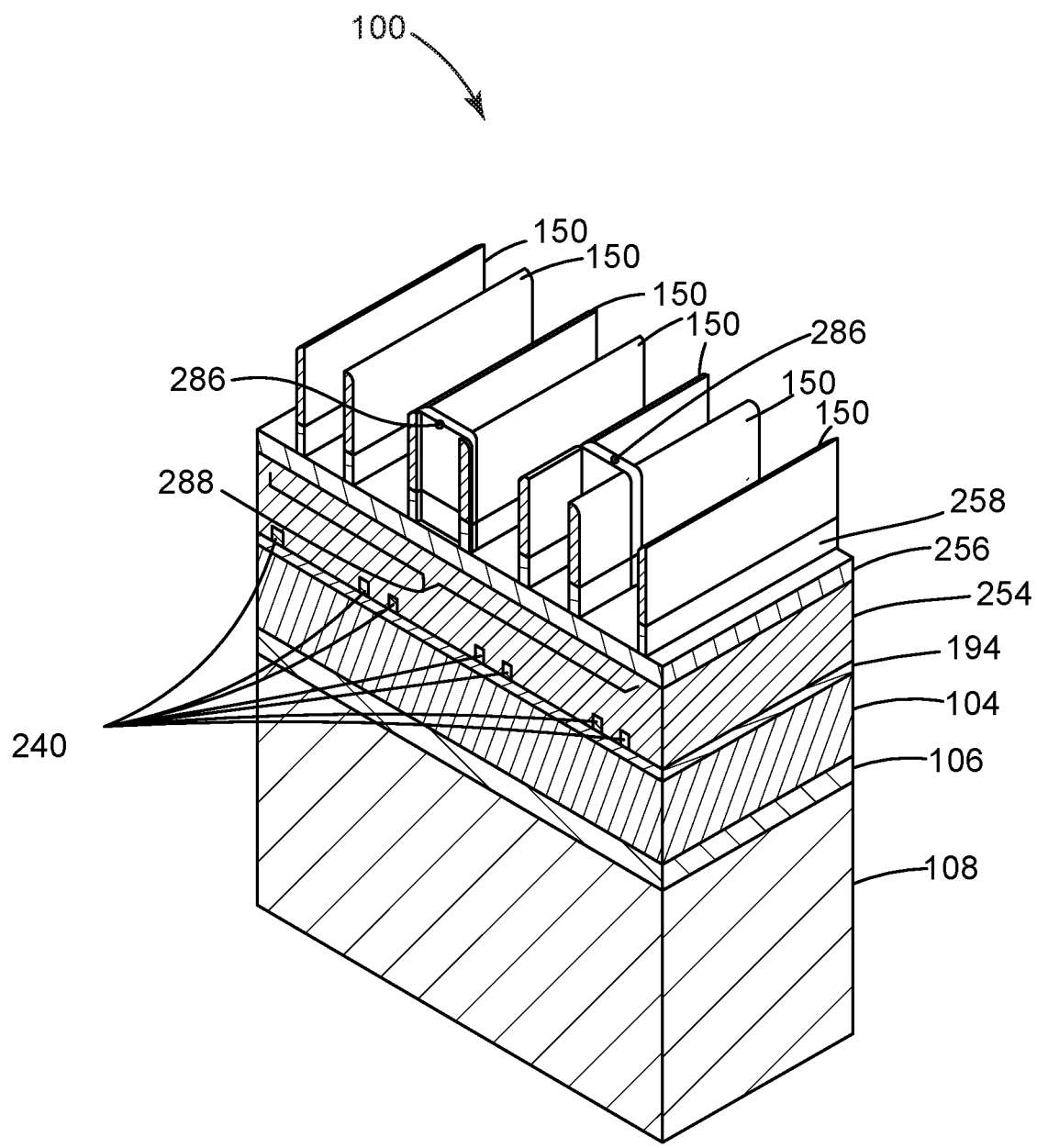
Figure 26:
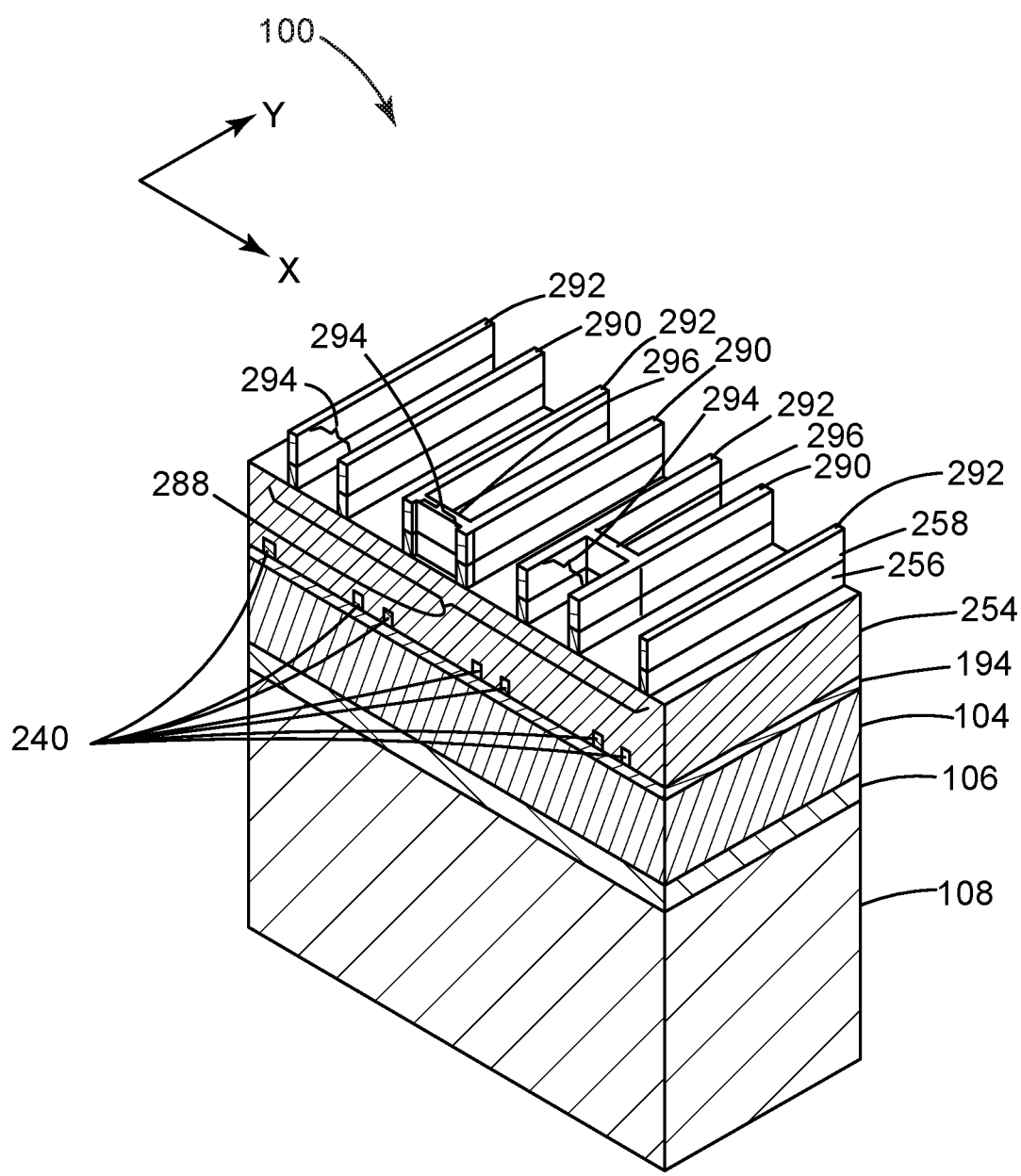
Figure 27:
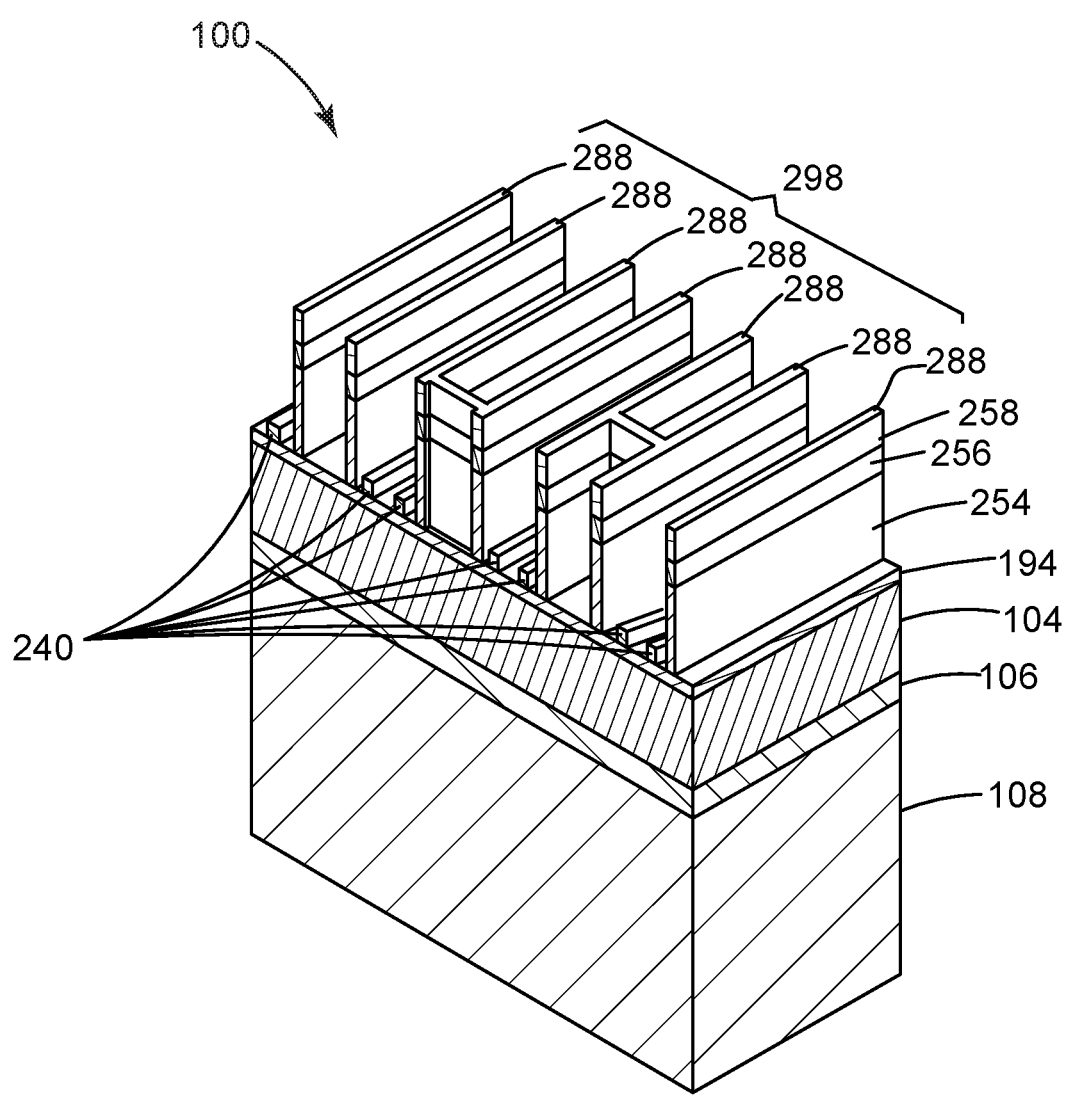
Figure 28:
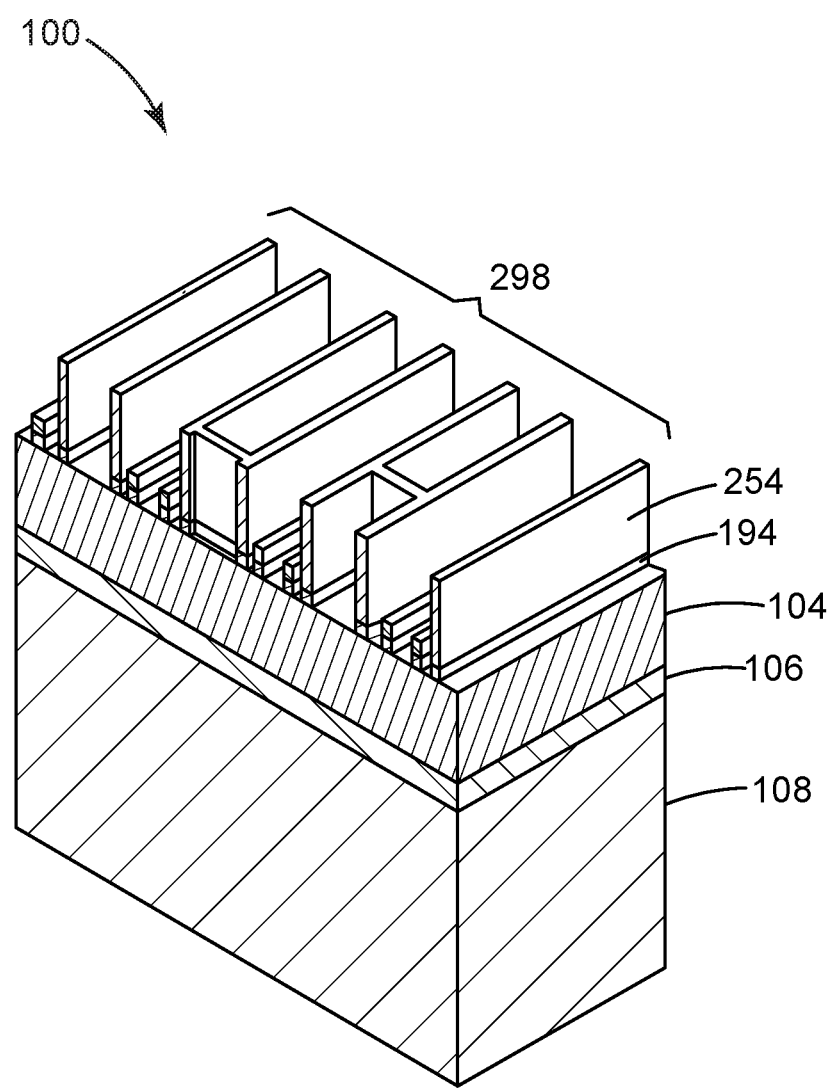
Figure 29:
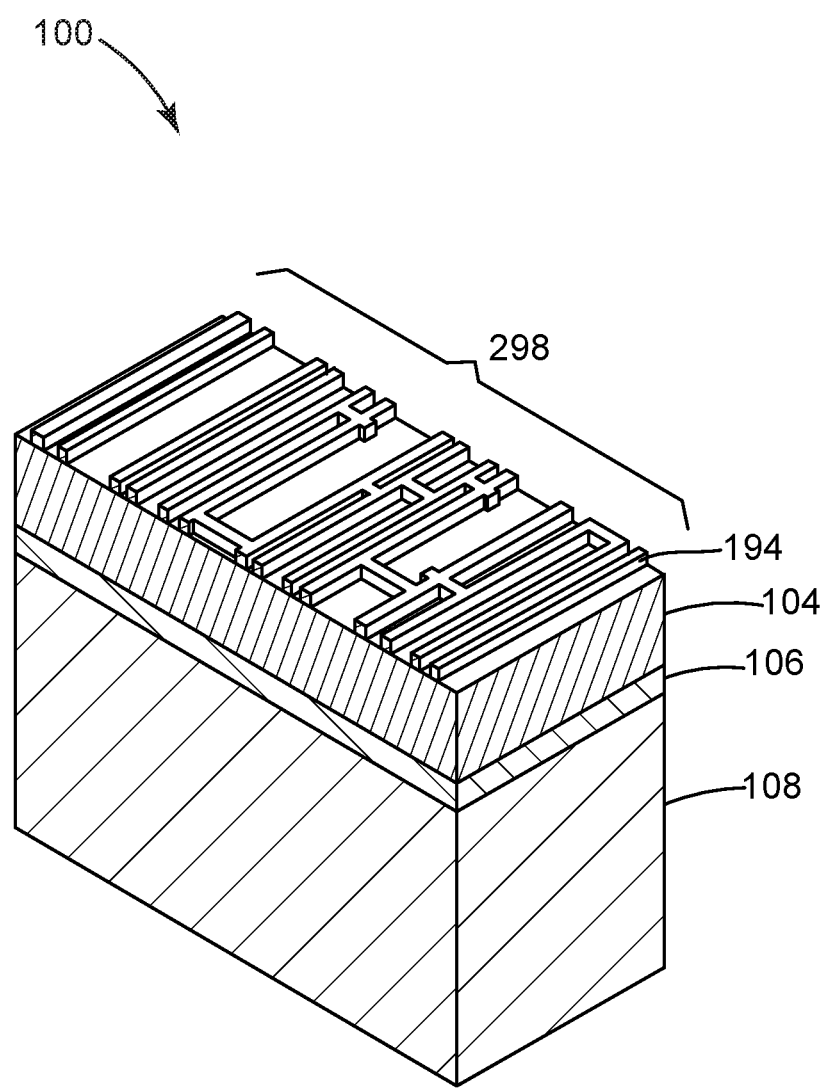
Figure 30:
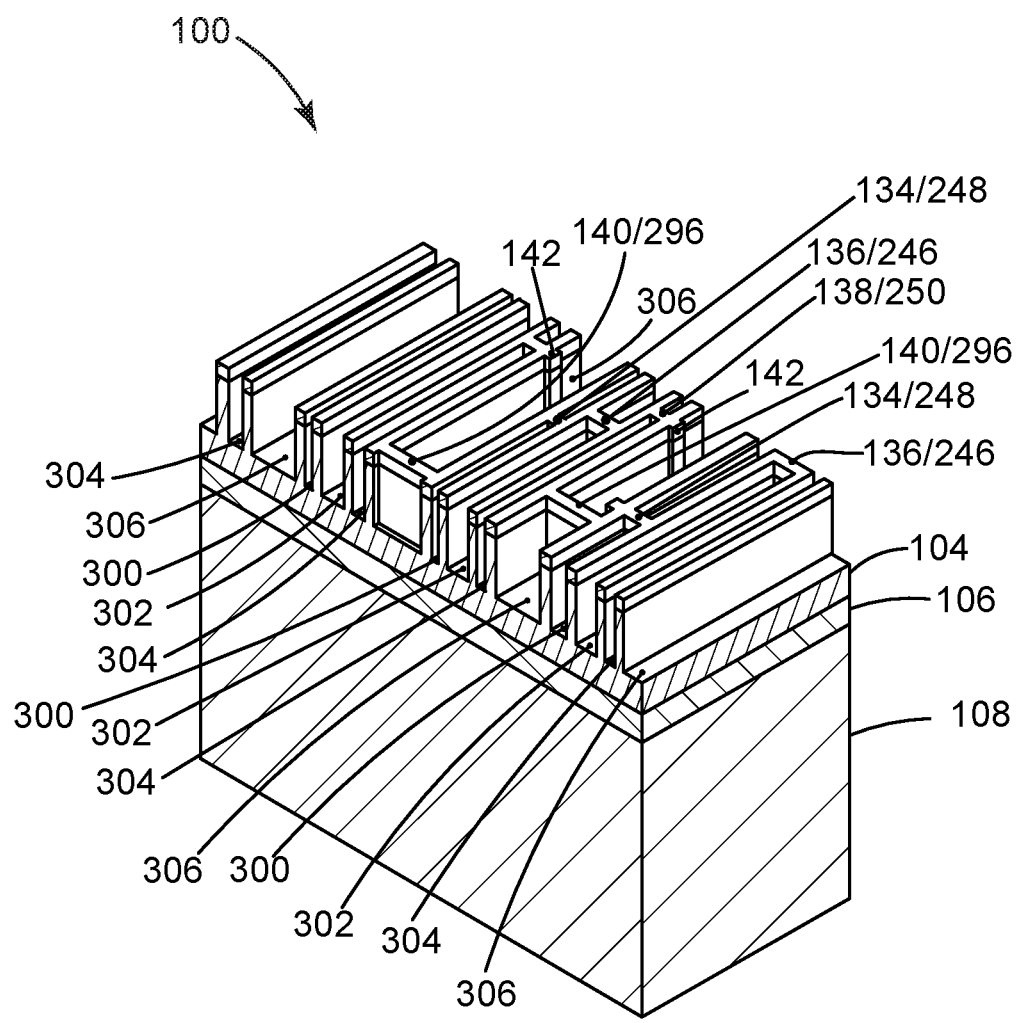
Figure 31:
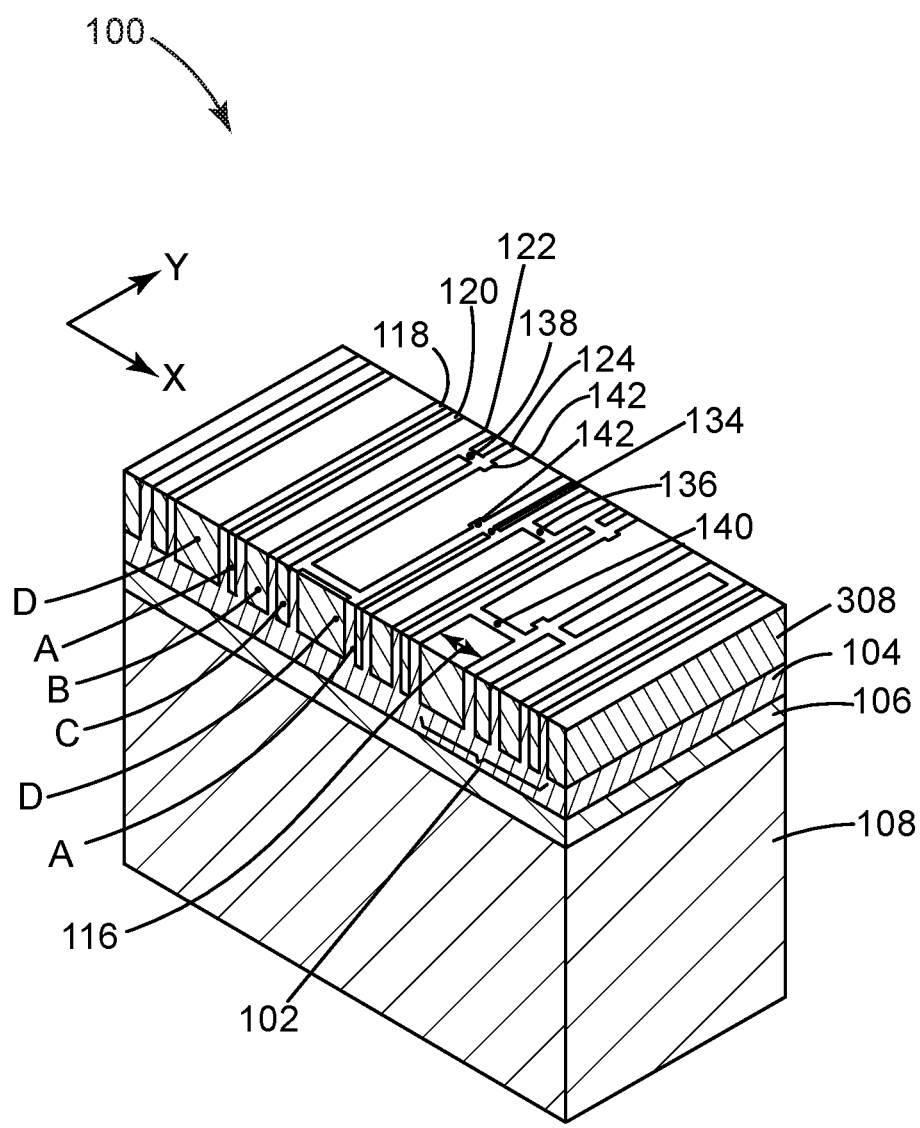

FIG. 16 is a perspective view of the structure of FIG. 15A having the 1st mandrels and the 3rd hardmask layer removed to reveal a 1st pattern portion memorized into the 2nd hardmask layer and disposed over the 1st hardmask layer in accordance with the present invention;

FIG. 17 is a perspective view of the structure of FIG. 16 having (from top to bottom) a 2nd mandrel layer and 6th, 5th and 4th hardmask layers disposed thereon in accordance with the present invention;

FIG. 18 is a perspective view of the structure of FIG. 17 having a 4th lithographic stack disposed thereon and 2nd mandrels patterned into a resist layer of the 4th lithographic stack in accordance with the present invention;

FIG. 19 is a perspective view the structure of FIG. 18 having the 2nd mandrels patterned into the 2nd mandrel layer in accordance with the present invention;

FIG. 20A is a perspective view of the structure of FIG. 19 having a 5th lithographic stack disposed thereon and 3rd openings patterned into a resist layer of the 5th lithographic stack in accordance with the present invention;

FIG. 20B is a cross-sectional perspective view of FIG. 20A taken along the line 20B-20B in accordance with the present invention;

FIG. 21 is a perspective view of the structure of FIG. 20 B having the 3rd openings etched into and entirely across the 2nd mandrels in accordance with the present invention;

FIG. 22 is a perspective view of the structure of FIG. 21 having the 5th lithographic stack removed in accordance with the present invention;

FIG. 23 is a perspective view of the structure of FIG. 22 having a 2nd mandrel spacer layer disposed thereon in accordance with the present invention;

FIG. 24 is a perspective view of the structure of FIG. 23 after the 2nd mandrel spacer layer has been anisotropically etched to form 2nd mandrel spacers and the 2nd mandrels have been removed to form a 2nd pattern portion disposed on the 6th hardmask layer in accordance with the present invention;

FIG. 25 is a perspective view of the structure of FIG. 24 having the 2nd pattern portion anisotropically etched into the 6th hardmask layer in accordance with the present invention;

FIG. 26 is a perspective view of the structure of FIG. 25 having the 2nd pattern portion anisotropically etched into the 5th hardmask layer in accordance with the present invention;

FIG. 27 is a perspective view of the structure of FIG. 26 having the 2nd pattern portion anisotropically etched into the 4th hardmask layer and disposed onto the 1st hardmask layer, wherein the 1st and 2nd pattern portions form a final pattern on the 1st hardmask layer in accordance with the present invention;

FIG. 28 is a perspective view of the structure of FIG. 27 having the final pattern etched into the 1st hardmask layer and disposed onto the dielectric layer in accordance with the present invention;

FIG. 29 is a perspective view of the structure of FIG. 28 having remnants of the 4th hardmask layer and 2nd hardmask layer removed such that the final pattern is now exclusively in the 1st hardmask layer and disposed directly over the dielectric layer in accordance with the present invention;

FIG. 30 is a perspective view of the structure of FIG. 29 wherein the final pattern is utilized to etch a series of A trenches, B trenches, C trenches and D trenches 306 into the dielectric layer in accordance with the present invention; and FIG. 31 is a perspective view of the structure of FIG. 30 after the semiconductor structure has been metalized and planarized to finalize formation of the cells into the dielectric layer, wherein FIG. 31 is also a perspective view of FIGS. 1A and 1B.

DETAILED DESCRIPTION

Certain exemplary embodiments will now be described to provide an overall understanding of the principles of the structure, function, manufacture, and use of the methods, systems, and devices disclosed herein. One or more examples of these embodiments are illustrated in the accompanying drawings. Those skilled in the art will understand that the methods, systems, and devices specifically described herein and illustrated in the accompanying drawings are non-limiting exemplary embodiments and that the scope of the present invention is defined solely by the claims. The features illustrated or described in connection with one exemplary embodiment may be combined with the features of other embodiments. Such modifications and variations are intended to be included within the scope of the present invention.

FIGS. 1A-31 illustrate various exemplary embodiments of an apparatus, and method of making the same, of cells of an interconnect system for a semiconductor structure, wherein the spaces between lines within the cell are not subject to lithographic variation and the widths of the lines are variable in accordance with the present invention. Additionally the method and apparatus can apply cuts to the signal lines and power lines of the cells that are tolerant of lithographic overlay problems and that do not inadvertently cut or notch any of the signal lines.

Moreover, the invention can be applied to semiconductor cells of interconnection lines having a minimum pitch of 38 nm or less. Additionally, the invention may be applied to semiconductor cells of any number of tracks, for example, 5 track, 6 track and more.

More specifically, the following FIGS. 1A-3 describe structural features of the cells in accordance with the present invention. Additionally FIGS. 4-31 describe methods of making the cells in accordance with the present invention.

Referring to FIG. 1A, a simplified cross-sectional view of an exemplary embodiment of a semiconductor structure 100 of an integrated circuit in accordance with the present invention is presented. Structure 100 includes a plurality of fully formed semiconductor cells 102 of metal interconnect lines A, B, C and D, which are disposed in a dielectric layer 104.

The dielectric layer 104 is composed of a dielectric isolation material such as a low K or ultra low K (ULK) material or various combinations of silicon, carbon, oxygen and hydrogen (an SiCOH layer). The dielectric layer may be disposed over an etch-stop hard mask layer 106, such as a silicon nitride (SiN) or similar. The etch stop layer 106 may be disposed over a complex stack of buried layers 108 from the substrate (not shown) upwards.

The top surfaces of layers 104, 106 and the buried layers of stack 108 are all planarized to be substantially parallel to each other. For purposes herein, the direction perpendicular to those top surfaces will be designated the vertical direction (as represented by the arrow 109).

The metal lines A, B, C and D of each cell 102 form an array of substantially parallel metal lines disposed within the dielectric layer 104. In this embodiment, the lines A, B and C represent signal lines for transmitting signals to and from devices in structure 100. Also, in this embodiment, the line D represents a power line for transmitting power to the devices in structure 100. As such, the power line D is required to carry significantly more current relative to signal lines A, B, C and, therefore, will be proportionally larger in width. Each of the metal lines A, B, C, D have line widths 110, 112, 114, 116 respectively that are substantially equal to or greater than a predetermined minimum line width 154 (best seen in FIG. 2) utilized in the manufacture of the structure 100.

A plurality of first ($1^{st}$) 118, second ($2^{nd}$) 120, third ($3^{rd}$) 122 and fourth ($4^{th}$) 124 line spacers are disposed between the metal lines A, B, C, D and have the dielectric isolation material of dielectric layer 104 disposed therein. The line spacers 118, 120, 122, 124 have first 126, second 128, third 130 and fourth 132 line spacer widths respectively that are substantially equal to or greater than a predetermine minimum line spacer width 158 (best seen in FIG. 2) that is adequate to provide proper electrical isolation between the metal lines A, B, C, D.

As will be explained in greater detail herein, not all of the line widths 110, 112, 114, 116 are substantially equal. In this particular embodiment, the line widths 110, 112, and 114 of lines A, B and C respectively are set substantially equal to the minimum line width 154. Additionally, in this particular embodiment, the line width 116 of line D is set substantially equal to twice the minimum line width 154 plus the minimum line spacer width 158.

Also, as will be explained in greater detail herein, the line spacer widths include a first pair of line spacer widths that are substantially equal to each other and a second adjacent pair of line spacer widths that are substantially equal to each other. More specifically, in this embodiment, the first and fourth line spacer widths 126, 132 represent the first pair of line spacer widths that are substantially equal to each other. The second and third line spacer widths 128, 130 represent the second pair of line spacer widths that are substantially equal to each other. Moreover, the second pair of line spacer widths 128, 130 are adjacent to the first pair of line spacer widths 126, 132. These alternating first pair 126, 132 and second pair 128, 130 of line spacers will continue from cell to cell along a plurality of cells in the X direction (perpendicular to the metal lines) of the dielectric layer 104. In this particular embodiment, the line spacer widths 126, 128, 130, 132 of line spacers 118, 120, 122, 124 respectively are set substantially equal to the minimum line spacer width 158.

Referring to FIG. 1B, a simplified top view of the semiconductor structure of FIG. 1A is presented in accordance with the present invention. As can be seen, a plurality of continuity cuts or (continuity blocks) may be disposed in signal lines A, B, C and in the power line D. More specifically, a continuity cut 134 is disposed on signal line A, a continuity cut 136 is disposed in signal line B, a continuity cut 138 is disposed in signal line C and a continuity cut 140 is disposed in power line D.

The cuts 134, 136, 138, 140 can be grouped into three types of cuts relative to the power line D. That is, cut 136 is a first cut type, which cuts across the entire width 112 of signal line B that is not adjacent to any side of power line D. Cuts 134 and 138 are a second cut type, which cuts across the entire widths 110, 114 of signal lines A and C respectively that are adjacent to opposing sides of power line D. Finally cut 140 is a third cut type, which cuts across the entire width 116 of the power line D itself.

It is important to note that the cuts 134, 136, 138 and 140 are not required to be disposed in their respective lines A, B, C, D. That is, an embodiment of semiconductor structure 100 may include any combination of cuts 134, 136, 138 140 in any combination of cells containing lines A, B, C, D. In this particular embodiment however, every line A, B, C, D has a respective continuity cut 134, 136, 138, 140 disposed therein.

It is also important to note that there are a plurality of unique notches 142 disposed in the power lines D only. By contrast, none of the signal lines A, B, C have a notch disposed therein. As will be explained in greater detail herein, this is because the second cut types 134, 138 are only partially self-aligned to their respective signal lines A and C. That is, the second cut types 134, 138 are fully aligned in the X direction to a first side 141 of the signal lines A, C that is furthest from the adjacent power line D. Therefore, the cutting process for producing cuts 134, 138 is not affected by lithographic tolerances on that first side 141. However, the second cut types 134, 138 are not fully aligned in the X direction on a second opposing side 143 of the signal lines A, C that is closest to the adjacent power line D. Therefore, the cutting process is affected by such lithographic tolerances on that opposing side 143. As such, the process of forming the cuts 134, 138 in lines A and C cannot extend into signal line B, but can extend, and dispose a notch 142, into power line D.

Additionally, as will be explained in greater detail herein, the first cut types 136 through signal line B and the third cut types 140 through the power line D are fully self-aligned on both sides, so the process that is used to form those cuts 136, 140 will not notch any adjacent lines. Accordingly, only power line D will have notches 142 disposed in them and none of the signal lines will have notches disposed in them.

Accordingly, power lines D will include a plurality of notches 142 disposed in them. The notches 142 will be disposed across a partial width of the power lines D. The notches preferably cut 20 percent or less of the width 116 of power line D, more preferably cut 15 percent or less of the width 116 and most preferably cut 10 percent or less of the width of 116. Additionally, the notches 142 will be aligned in the X direction with one of the continuity cuts 134 and 138 (i.e., the second cut type).

Note also, that not every cut 134, 138 will produce a notch in the power lines D. This is because, the notches will occur when the lithographic tolerances are great enough to extend the cutting process over and into power line D, which will almost certainly happen in a plurality of cases. In some cases however, such as for example cut 134A, the lithographic tolerances will be small enough to not produce a notch in the adjacent power line D.

Referring to FIG. 2, a simplified cross sectional view of a plurality of the cells 102 of semiconductor structure 100, without the dielectric layer 104, is superimposed over an imaginary cell 102$i$. Additionally the relative positions of yet to be formed first mandrels 144 and their associated $1^{st}$ mandrel spacers 146 are shown superimposed over the cells 102. Finally the relative positions of yet to be formed $2^{nd}$ mandrels 148 and their $2^{nd}$ mandrel spacers 150 are shown superimposed over the $1^{st}$ mandrels 144.

The process flow that forms the lines A, B, C, D, mandrels 144, 148 and spacers 146, 150 will be discussed in greater detail herein. The superposition in FIG. 2 of these structures over the cells 102 are used to illustrate which specific structures control and define the lines A, B, C, D and line spacers 118, 120, 122, 124 of the cells 102 during the process flow of semiconductor structure 100.

Imaginary cell 102$i$ is composed of a plurality of parallel minimum metal lines 152 having the predetermined minimum line width 154, wherein the metal lines 152 are separated by minimum line spacers 156 having the minimum line spacer width 158. The combination of a minimum line width 154 and minimum line spacer width 158 defines a cell track 160. Each cell track 160 is also considered to be a minimum pitch 160 of the cells 102 and 102i.

As will be explained in greater detail herein, the cell 102 has an overall cell height 162 that is substantially equal to an integer multiple of a plurality of cell tracks 160. In this particular embodiment, the overall cell height 162 of cell 102 is substantially equal to 5 cell tracks 160 combined and, therefore, is known as a five track cell. One skilled in the art would recognize that the overall cell height 162 may be equal to other integer multiples of cell track 160. For example, the cell height 162 could be equal to 6 cell tracks 160 in width, in which case the cell 102 would be referred to as a six track cell. Also, cell height 162 may be a non-integer multiple of the cell track, as in 5.33, 5.66, 6.33 or 7.5 track and the like.

It is important to note that the minimum cell pitch 160 may be 38 nm or less. So, for example, the minimum cell pitch 160 of this cell 102 may be 36 nm, 32 nm, 28 nm, 26 nm or smaller, in accordance with the present invention.

The first mandrels 144 have a $1^{st}$ mandrel width 164 and a $1^{st}$ mandrel spacing 166 between the first mandrels 144, which together form a $1^{st}$ mandrel pitch 168. The first mandrels 144 are patterned into structure 100 lithographically and, as such, are very flexible in terms of their width 164 and spacing 166, but are subject to lithographic tolerances.

The $1^{st}$ mandrel spacers 146 are formed on opposing $1^{st}$ mandrel sidewalls 167 of the first mandrels 144, and have a $1^{st}$ spacer width 170. In contrast to the formation of the $1^{st}$ mandrels 144, the $1^{st}$ mandrel spacers are typically formed by an atomic layer deposition (ALD) process, so they are not subject to lithographic tolerances, but they are less flexible in terms of their width 170.

As can be seen from the vertical projection lines 171 of FIG. 2, the widths 170 of $1^{st}$ mandrel spacers 146 exclusively control the widths 128, 130 of the $2^{nd}$ and $3^{rd}$ line spacers 120, 122. Additionally, the $1^{st}$ mandrel spacing 166 (minus the widths 170 of two spacers 146) exclusively controls the width 112 of line B. Accordingly, the $2^{nd}$ and $3^{rd}$ spacer widths 128, 130 are very tightly controlled, can be made very small, and are not subject to lithographic tolerance issues. Moreover, the width 112 of line B is very adjustable, but is subject to lithographic tolerance issues.

The second mandrels 148 have a $2^{nd}$ mandrel width 172 and a $2^{nd}$ mandrel spacing 174 between the $2^{nd}$ mandrels 148, which together form a $2^{nd}$ mandrel pitch 176. The $2^{nd}$ mandrels 148 are patterned into structure 100 lithographically and, as such, are very flexible in terms of their width 172 and spacing 174, but are subject to lithographic tolerances.

The $2^{nd}$ mandrel spacers 150 are formed on opposing $2^{nd}$ mandrel sidewalls 177 of the $2^{nd}$ mandrels 148, and have a $2^{nd}$ spacer width 178. In contrast to the formation of the $2^{nd}$ mandrels 148, the $2^{nd}$ mandrel spacers 150 are typically formed by an atomic layer deposition (ALD) process, so they are not subject to lithographic tolerances, but they are less flexible in terms of their width 178.

It is important to note that the $2^{nd}$ mandrel pitch 176 is set substantially equal to the $1^{st}$ mandrel pitch 168 and that the $2^{nd}$ mandrel width 172 of the $2^{nd}$ mandrels 148 is set substantially less than the $1^{st}$ mandrel width 164 of the $1^{st}$ mandrels 144. Moreover, the $2^{nd}$ mandrels 148 are positioned relative to the $1^{st}$ mandrels 144 so that the $2^{nd}$ mandrels 148 completely overlay the $1^{st}$ mandrels 144.

As such, the $1^{st}$ mandrels 144 include an A line extension 180 and an opposing C line extension 182 formed by a pair of portions of the $1^{st}$ mandrel 144 which extend in opposing X directions (as represented by the dual headed arrow 183) beyond the sidewalls 177 of the overlaying $2^{nd}$ mandrel 148. The A line extension 180 has an A line extension width 184 equal to the distance the $1^{st}$ mandrel sidewall 167 on the end of the A line extension 180 extends in the X direction beyond the $2^{nd}$ mandrel sidewall 177 of the overlaying $2^{nd}$ mandrel 148. The C line extension 182 has a C line extension width 186 equal to the distance the $1^{st}$ mandrel sidewall 167 on the end of the C line extension extends in the opposing X direction beyond the $2^{nd}$ mandrel sidewall 177 of the same overlaying $2^{nd}$ mandrel 148.

The difference in length between the $1^{st}$ mandrel width 164 and the $2^{nd}$ mandrel width 172, plus the position of the $2^{nd}$ mandrel 148 relative to the $1^{st}$ mandrel 144 (i.e., whether the $2^{nd}$ mandrel 148 is centered over the $1^{st}$ mandrel 144 or more to one side) defines the widths 184, 186 of the A line extension 180 and C line extension 182. However, in this embodiment, the $2^{nd}$ mandrel 148 is centered over the $1^{st}$ mandrel 144, so the widths 184, 186 of the A and C line extensions 180, 184 are set to be substantially equal. Also in this embodiment, the equal widths 184, 186 remain constant and equal from cell 102 to cell 102. Note, that if the $1^{st}$ mandrel pitch 168 were not set equal to the $2^{nd}$ mandrel pitch 176, then widths 184, 186 would not be able to remain equal and constant from cell 102 to cell 102 within a potentially large number of cells 102 of the structure 100.

As can also be seen from the vertical projection lines 171 of FIG. 2, the $2^{nd}$ spacer widths 178 of $2^{nd}$ mandrel spacers 150 exclusively control the spacer widths 126, 132 of the $1^{st}$ and $4^{th}$ line spacers 118, 124. Additionally, the $2^{nd}$ mandrel width 172 of the $2^{nd}$ mandrel 148 exclusively controls the width 116 of line D. Also, the A line extension width 184 (minus the $2^{nd}$ spacer width 178) controls the width 110 of line A. Additionally, the C line extension width 186 (minus the $2^{nd}$ spacer width 178) controls the width 114 of line C.

Accordingly, the $1^{st}$ and $4^{th}$ line spacer widths 126, 132 are very tightly controlled, can be made very small, and are not subject to lithographic tolerance issues. Moreover, the widths 110, 114, 116 of lines A, C and D respectively are very variable, but are subject to lithographic tolerance issues.

Referring to FIG. 3, a simplified top view of a plurality of the cells 102 of semiconductor structure 100 is presented. Additionally, superimposed over the cells 102 are the yet to be formed $1^{st}$ mandrels 144 and second mandrels 148. Finally, superimposed over the mandrels 144, 148 are yet to be formed $1^{st}$ $2^{nd}$ and $3^{rd}$ openings 188, 190, 192, which will be patterned into resist layers during the process flow of structure 100.

The process flow that forms the continuity cuts 134, 136, 138, 140 and the notches 142 will be discussed in greater detail herein. The superposition in FIG. 3 of these structures over the cells 102 are used to illustrate which specific structures control and define the cuts 134, 136, 138, 140 and notches 142 of the cells 102 during the process flow of semiconductor structure 100.

Cells 102 each include their respective lines A, B, C, D separated by their respective line spacers 118, 120, 122, 124. Cell 102 also includes continuity cuts 134, 136, 138, 140 in lines A, B, C, D respectively, as well as a plurality of notches 142 in power line D. As discussed earlier, continuity cut 136 is categorized as a first type cut through line B, because it cuts a line that is not adjacent to power line D. Cuts 134 and 138 are categorized as second type cuts through lines A and C, because they cut lines that are adjacent to the power line D. Finally, cut 140 is categorized as a third type cut, because it cuts directly through power line D.

During the process flow, the 1$^{st}$ opening 188 (best seen in FIGS. 7A and 7B) will be utilized to form the first type cuts 136 through the B signal lines. The 2$^{nd}$ openings 190 (best seen in FIGS. 10A and 10B) will be utilized to form the second type cuts 134, 138 through the A and C signal lines. The 3$^{rd}$ openings 192 (best seen in FIGS. 20A and 20B) will be utilized to form the third type cuts 140 through the D power lines.

As will be explained in greater detail herein, the first and third type cuts 136, 140 are fully self aligned and the second type cuts 134, 138 are partially self aligned on one side. As such, the openings 188, 190, 192 used to form the cuts can be made relatively large compared to conventional openings in cuts that are not self-aligned at all.

That is, 1$^{st}$ opening 188 can be targeted to span from the center of one 1$^{st}$ mandrel 144 to the center of an adjacent 1$^{st}$ mandrel 144, yet be patterned down to only provide a cut 136 through a single line B. The 3$^{rd}$ opening 192 can be targeted to span from the center of a 2$^{nd}$ mandrel spacing 174 between the 2$^{nd}$ mandrels 148 to the center of an adjacent 2$^{nd}$ mandrel spacing 174, yet be patterned down to only provide a cut 140 through a single power line D. It should be noted that in this exemplary embodiment, the center to center distance between 2$^{nd}$ mandrel spacings 174 is equivalent to the center of one line B in one cell 102 to the center of another line B in an adjacent cell 102.

Finally, the second openings 190 can be targeted to span from the center of line B on its self-aligned side to the center of the line spacer 118 or 124 on its non-self-aligned side. Note that for the second opening 190, it will pattern down to fully cut either lines A or C that are adjacent power lines D. However, because of lithographic tolerances, the opening may over extend its targeted placement and cut a portion of the power lines D, therefore forming a notch 142 in the power line. However, because the power line D has a width 116 that is much larger than the widths 110, 112, 114 of the signal lines A, B, C, the power line will still be able to function normally. Typically, the notch 142 will be 20 percent or less than the width 116 of the power line D.

The following FIGS. 4-31 will describe the process flow utilized to form the cells 102. The process flow will include the formation of the variable metal signal lines A, B, C and power line D, and their associated line spacers 118, 120, 122, 124. The process flow will also include the fully self aligned continuity cuts 136 and 140. Additionally, the process flow will include the partially self aligned cuts 134, 138 as well as the notches 142 in the power lines D.

Referring to FIG. 4, a stack is provided which includes the buried layers 108, the etch stop layer 106 and the dielectric layer 104 as discussed earlier. Disposed respectively over the dielectric layer are a first hardmask layer 194 composed of a titanium nitride (TiN) or similar material, a second hardmask layer 196 composed of an amorphous silicon (aSi) or similar and a third hardmask layer 198 composed of a silicon nitride (SiN) or similar. Disposed over the third hardmask layer is a first mandrel layer 200 composed of an aSi or similar.

The 2$^{nd}$ hardmask layer 196 is relatively thick compared to the 1$^{st}$ and 3$^{rd}$ hardmask layers 194, 198. Preferably the 2$^{nd}$ hardmask layer 196 is at least twice as thick as the 1$^{st}$ and 3$^{rd}$ hardmask layers, more preferably at least three times as thick and most preferably at least 4 times as thick. This is because, later in the process flow, a plug of oxide material (or similar) will be formed in the 2$^{nd}$ hardmask layer 196 which will have to be large enough to withstand certain etching processes without being etched away completely. For example, the 2$^{nd}$ hardmask layer 196 will typically be within a range of 50 to 100 nm thick, while the 1$^{st}$ and 3$^{rd}$ hardmask layers 194, 198 will typically be within a range of 15 to 20 nm thick.

Referring to FIG. 5, a first lithographic stack (1$^{st}$ litho stack) 202 is next disposed onto the 1$^{st}$ mandrel layer 200. The litho stack 202 can be composed of several different kinds of layers, depending on such parameters as the application requirements, design or proprietary preferences or the like. One such stack of layers includes a stack of four thin films which includes (from bottom to top) a first spin-on hardmask layer (1$^{st}$ SOH) layer 204, a first SiON cap layer 206, a first bottom antireflective coating (BARC) layer 208, and a first resist layer 210. The 1$^{st}$ SOH layer 204 may be an organic planarization layer (OPL) deposited through a spin-on process and may be composed of an organic material such as amorphous carbon (aC) or similar.

Once the stack 202 is disposed over the 1$^{st}$ mandrel layer 200, an array of the 1$^{st}$ mandrels 144 is patterned into the resist layer 210 through well-known lithographic techniques. The 1$^{st}$ mandrels 144 are formed with the predetermined 1$^{st}$ mandrel width 164 and 1$^{st}$ mandrel spacing 166 between consecutive 1$^{st}$ mandrels 164 to form the 1$^{st}$ mandrel pitch 168.

Referring to FIG. 6, the first mandrels 144 are next patterned down to the 1$^{st}$ mandrel layer 200. For purposes of clarity, any feature herein, such as a spacer, a trench, an opening, a plug, a mandrel or the like, that is etched down (i.e., formed or patterned) from an original feature will be referred to as such original feature if it has the same form and function as the original feature. However, it is well-known that the etched down feature will be a translation of the original feature and will be composed of remnants of the various layers involved in the etching process. More specifically, in the case of the mandrels 144, the original mandrels 144 were etched into the resist layer 210 and may be composed primarily of material from resist layer 210 (best seen in FIG. 5). However, once the mandrels 144 have been etched down and translated into the 1$^{st}$ mandrel layer 200, the mandrels 144 may be composed primarily of the aSi material of the 1$^{st}$ mandrel layer 200 (best seen in FIG. 6).

Referring to FIG. 7A, the process of patterning the first openings 188 into the structure 100 is initiated by next disposing a second litho stack 212 over the mandrels 144. Similar to the 1$^{st}$ litho stack 202, the 2$^{nd}$ litho stack 212 can be composed of a 2$^{nd}$ SOH layer 214, a 2$^{nd}$ SiON cap layer 216, a 2$^{nd}$ BARC layer 218, and a 2$^{nd}$ resist layer 220.

The 1$^{st}$ opening 188 is then lithographically patterned into the 2$^{nd}$ resist layer 220 such that it at least spans the 1$^{st}$ mandrel spacing 166 including the predetermined location of signal line B. However, to best allow for lithographic tolerances, the 1$^{st}$ opening 188 is targeted to span from center to center across the 1$^{st}$ mandrels 144 (best seen in FIG. 3).

Referring to FIG. 7B, a cross sectional view of FIG. 7A taken along the line 7B-7B is presented. In FIG. 7B it can be seen that the 1$^{st}$ opening 188 is etched through the 2$^{nd}$ resist layer 220 down to the 2$^{nd}$ BARC layer 218.

Referring to FIG. 8, the 1$^{st}$ opening 188 is next anisotropically etched (as, for example, by a reactive ion etching (RIE) process or similar) down past the aSi mandrels 144 and through the SiN 3$^{rd}$ hardmask layer 198 to land on the aSi 2$^{nd}$ hardmaks layer 196. Because the mandrels 144 and 2$^{nd}$ hardmask layer 196 are composed of the same or similar aSi material, the SiN 3$^{rd}$ hardmask layer may be anisotropically etched selective to the mandrels and $2^{nd}$ hardmask layer 196 such that the edges of the mandrels 144 define (or self-align with) the edges of the opening 188 in the SiN $3^{rd}$ hardmask layer 198.

Referring to FIG. 9, the $2^{nd}$ SOH layer 214 is stripped off of structure 100. This may be done by several well-known processes, such as wet etching, ashing or similar.

Referring to FIG. 10A, the process of patterning the second openings 190 into the structure 100 is initiated by next disposing a $3^{rd}$ litho stack 222 over the mandrels 144. Similar to the $1^{st}$ and $2^{nd}$ litho stacks 202 and 212, the $3^{rd}$ litho stack 222 can be composed of a $3^{rd}$ SOH layer 224, a $3^{rd}$ SiON cap layer 226, a $3^{rd}$ BARC layer 228, and a $3^{rd}$ resist layer 230.

The $2^{nd}$ openings 190 are then lithographically patterned into the $3^{rd}$ resist layer 230 such that they at least span the predetermined locations of signal lines A and C. However, to best allow for lithographic tolerances, the 2nd openings 190 are targeted to span from the center of line B to the center of the line spacers 118, 124 adjacent to the power line D (best seen in FIG. 3).

Referring to FIG. 10B, a cross sectional view of FIG. 10A taken along the line 10B-10B is presented. In FIG. 10B it can be seen that the $2^{nd}$ openings 190 are etched through the $3^{rd}$ resist layer 230 down to the $3^{rd}$ BARC layer 228.

Referring to FIG. 11, the 2nd openings 190 are next anisotropically etched (as, for example, by a RIE process or similar) down through the $3^{rd}$ SOH layer 224 and into targeted locations of specific aSi mandrels 144 to land on the SiN $3^{rd}$ hardmask layer 198. These targeted locations span across the predetermined locations of the A and C lines and will be used to form the second type cuts 134, 138 later in the process flow. However, contrary to the etching process of the $1^{st}$ opening 188, the etching process for the $2^{nd}$ openings does not penetrate through the SiN $3^{rd}$ hardmask layer 198.

It is also important to note, that due to lithographic tolerances, the etching process will almost certainly over extend the $2^{nd}$ opening 190 into a portion of the targeted mandrels 144 where the yet to be formed power line D is to be located. This over extension of the $2^{nd}$ openings 190 will end up as notches 142 (best seen in FIG. 3) in the power lines D. The notches 142 will preferably be no greater than 20 percent of the width 116 of power lines D, more preferably no greater than 15 percent of the width 116 and most preferably no greater than 10 percent of the width 116.

It is also important to note that the lithographic tolerance control is precise enough to prevent the $2^{nd}$ openings 190 from spanning across the entire $1^{st}$ mandrel spacing 166 between the mandrels 144. Accordingly, the mandrels 144 adjacent to the targeted mandrels 144 of the $2^{nd}$ openings 190 are not notched by this etching process.

Referring to FIG. 12, the $3^{rd}$ SOH layer 224 is stripped off of structure 100. This may be done by several well-known processes, such as wet etching, ashing or similar.

Referring to FIG. 13A, a perspective view of FIG. 12 having a $1^{st}$ mandrel spacer layer 232 dispose thereon is presented. The $1^{st}$ mandrel spacer layer 232 has a predetermined first mandrel spacer layer thickness 234 and is conformally coated over first mandrels 144. The first mandrel spacer layer 232 may be an oxide layer (such as SiO2) and may be coated over the first mandrels 144 by an atomic layer deposition (ALD) process.

Referring to FIG. 13B, a cross sectional view of FIG. 13A taken along the line 13B-13B is presented. As can be seen from this view, the first mandrel spacer layer 232 has filled the $1^{st}$ opening 188 to form a $1^{st}$ cut plug 236. The first cut plug penetrates the entire depth of the SiN $3^{rd}$ hardmask layer 198.

The oxide $1^{st}$ cut plug 236 will be subjected to certain etching processes later during the process flow. The height of the cut plug 236 is defined by the thickness of the $3^{rd}$ hardmask layer 198. For that reason, the $3^{rd}$ hardmask layer 198 must be thick enough to allow the $1^{st}$ cut plug 236 to survive those etching processes without being entirely etched away. Typically, the thickness of the $3^{rd}$ hardmask layer 198 is within a range of 50-100 nm and is at least two, three or even four times as thick as the $1^{st}$ and $2^{nd}$ hardmask layers 194, 196.

Referring to FIG. 13C, a cross sectional view of FIG. 13A taken along the line 13C-13C is presented. As can be seen from this view, the first mandrel spacer layer 232 has also filled the $2^{nd}$ openings 190 to form a $2^{nd}$ cut plug 238. The $2^{nd}$ cut plugs penetrate through the $1^{st}$ mandrels 144, but do not penetrate the $3^{rd}$ hardmask layer 198.

Referring to FIG. 14, the SiO2 $1^{st}$ mandrel spacer layer 232 is anisotropically etched to form the $1^{st}$ mandrel spacers 146 on sidewalls of the $1^{st}$ mandrels 144. The $1^{st}$ mandrel spacers 146 have the $1^{st}$ spacer width 170 (best seen in FIG. 2) that is equal to the $1^{st}$ mandrel spacer layer thickness 234.

Note that with the spacers 146 in place, the $2^{nd}$ cut plugs 238 are effectively self-aligned with the sidewalls of the first mandrels 144. The cut plugs 238 extend from the sidewalls of the $1^{st}$ mandrels 144 toward the center of the mandrels. The location of the distal ends of the $2^{nd}$ cut plugs 238 that extend toward the mandrel centers are not self-aligned and are subject to lithographic tolerances. As such, the $2^{nd}$ cut plugs will be utilized to form the second type cuts in signal lines A and C, but will also often overlay the locations of the power lines D to form the plurality of notches 142 therein. However, control of the lithographic process in the formation of the $2^{nd}$ openings 190 and $2^{nd}$ cut plugs 238 is precise enough to assure the notches 142 do not extend a significant enough distance across the width 116 of power lines D to impair performance. Typically the notches 142 formed are 20 percent or less than the width 116 of the power lines D.

Referring to FIGS. 15A and 15B wherein FIG. 15A is a cross sectional view of FIG. 14 taken along the line 15A-15A after the $1^{st}$ mandrels have been pulled and wherein FIG. 15B is a cross sectional view of FIG. 14 taken along the lines 15B-15B after the $1^{st}$ mandrel has been pulled. Next in the process flow the first mandrels 144 are then removed or stripped. The removal of the first mandrels 144 can be done with anyone of several well-known processes, such as a wet etching process, a RIE process or similar.

Thereafter, the structure 100 can be anisotropically etched selective to the oxide spacers 146, $1^{st}$ cut plugs 236 and $2^{nd}$ cut plugs 238. The etching process substantially vertically etches down through the SiN $3^{rd}$ hardmask layer 198 and aSi $2^{nd}$ hardmask layer 196 to land on the TiN first hardmask layer 194.

Referring more specifically to FIG. 15A, the first cut plug 236 can best be seen. First cut plug 236 penetrates the entire SiN $3^{rd}$ hardmask layer 198.

Referring more specifically to FIG. 15B, the second cut plug 238 can best be seen. Second cut plug 236 does not penetrate the SiN $3^{rd}$ hardmask layer 198.

Referring to FIG. 16, the spacers 146, plugs 236, 238 and remainder of the SiN $3^{rd}$ hardmask layer 198 are removed via any one of several well-known processes to reveal a first pattern portion 240 that has been memorized into the aSi $2^{nd}$ hardmask layer 196 and disposed over the TiN $1^{st}$ hardmask layer 194.

The first pattern portion 240 includes a plurality of pairs of $2^{nd}$ line spacer molds 242 and a $3^{rd}$ line spacer molds 244 which were formed from the $1^{st}$ mandrel spacers 146. The $2^{nd}$ and $3^{rd}$ line spacer molds 242, 244 extend longitudinally in the Y direction. The $2^{nd}$ and $3^{rd}$ lines spacers molds 242, 244 define the locations of the $2^{nd}$ and $3^{rd}$ lines spacers 120, 122 that will be patterned into the dielectric layer 104. Additionally, a B line space 252 between the line spacer molds 242, 244 provides the location of the B signal line which will also be patterned into the dielectric layer 104 later in the process flow.

The first pattern portion 240 also includes a plurality of B cut mask sections 246, formed from the $1^{st}$ cut plugs 236, which extend between the line spacer molds 242, 244 in the X direction. The B cut mask sections span the B line space 252 to define the locations of the first type continuity cuts 136 in the B signal line.

Further, the first pattern portion 240 includes a plurality of A cut mask sections 248, which extend in the X direction from the $2^{nd}$ line spacer molds 242. Additionally the first pattern portion 240 includes a plurality of C cut mask sections 250 which extend in an opposing X direction from the $3^{rd}$ line spacer molds 244. The A and C cut mask sections 248, 250 were formed from the $2^{nd}$ cut plugs 238. The A cut mask sections 248 and C cut mask sections 250 span the A and C signal lines to define the locations of the second type continuity cuts 134, 138 in the A and C lines respectively.

Referring to FIG. 17, next in the process flow the structure 100 stack is rebuilt through several well-known processes in order to form the $2^{nd}$ mandrels 148. Accordingly a fourth ($4^{th}$) hardmask layer 254, a fifth ($5^{th}$) layer 256 and a sixth ($6^{th}$) hardmask layer 258 are disposed respectively over structure 100. Disposed over the $6^{th}$ hardmask layer is a $2^{nd}$ mandrel layer 260.

In this embodiment, the $4^{th}$ hardmask layer 254 is a self planarizing spin-on hardmask (SOH) layer composed of an aC or similar. The $5^{th}$ hardmask layer 256 is composed of SiO2 or similar and the $6^{th}$ hardmask layer 258 is of composed of SiN or similar. The $2^{nd}$ mandrel layer 260 is composed of aSi or similar.

Referring to FIG. 18, a 4th lithographic stack ($4^{th}$ litho stack) 262 is next disposed onto the $2^{nd}$ mandrel layer 260. The litho stack 262 includes (from bottom to top) a $4^{th}$ SOH layer 264, a $4^{th}$ SiON cap layer 266, a $4^{th}$ BARC layer 268, and a $4^{th}$ resist layer 270.

Once the stack 262 is disposed over the $2^{nd}$ mandrel layer 260, an array of the $2^{nd}$ mandrels 148 is patterned into the resist layer 270 through well-known lithographic techniques. The $2^{nd}$ mandrels 148 are formed with the predetermined $2^{nd}$ mandrel width 172 and $2^{nd}$ mandrel spacing 174 between consecutive $2^{nd}$ mandrels 148 to form the $2^{nd}$ mandrel pitch 176.

Referring to FIG. 19, the $2^{nd}$ mandrels 148 are next patterned down to the $2^{nd}$ mandrel layer 260. This can be done through a RIE etch process or similar.

Referring to FIG. 20A, the process of patterning the $3^{rd}$ openings 192 into the structure 100 is initiated by next disposing a $5^{th}$ litho stack 272 over the $2^{nd}$ mandrels 148. Similar to the previous litho stacks, the $5^{th}$ litho stack 272 is composed of a $5^{th}$ SOH layer 274, a $5^{th}$ SiON cap layer 276, a $5^{th}$ BARC layer 278, and a $5^{th}$ resist layer 280.

The $3^{rd}$ opening 192 is then lithographically patterned into the $5^{th}$ resist layer 280 such that it at least spans the $2^{nd}$ mandrels 148, which determine the locations of power line D. However, to best allow for lithographic tolerances, the $3^{rd}$ opening 192 is targeted to span from the center of a $2^{nd}$ mandrel spacing 174 between the $2^{nd}$ mandrels 148 to the center of an adjacent $2^{nd}$ mandrel spacing 174. It should be noted that in this exemplary embodiment, the center to center span across adjacent $2^{nd}$ mandrel spacings 174 is equivalent to the center to center span across adjacent signal lines B (best seen in FIG. 3).

Referring to FIG. 20B, a cross sectional view of FIG. 20A taken along the line 20B-20B is presented. In FIG. 20B it can be seen that the $3^{rd}$ opening 192 is etched through the $5^{th}$ resist layer 280 down to the $5^{th}$ BARC layer 278.

Referring to FIG. 21, the $3^{rd}$ opening 192 is next anisotropically etched (as, for example, by a reactive ion etching (RIE) process or similar) down through the aSi $2^{nd}$ mandrels 148 to land on the SiN $6^{th}$ hardmask layer 258.

Referring to FIG. 22, the $5^{th}$ SOH layer 274 is stripped off of structure 100. This may be done by several well-known processes, such as wet etching, ashing or similar. As such, the $3^{rd}$ openings 192 are revealed to span and self-align with the sidewalls of the $2^{nd}$ mandrels 148.

Referring to FIG. 23, a perspective view of FIG. 22 having a $2^{nd}$ mandrel spacer layer 282 dispose thereon is presented. The $2^{nd}$ mandrel spacer layer 282 has a predetermined $2^{nd}$ mandrel spacer layer thickness 284 and is conformally coated over $2^{nd}$ mandrels 148. The $2^{nd}$ mandrel spacer layer 282 may be an oxide layer (such as SiO2) and may be coated over the $2^{nd}$ mandrels 148 by an atomic layer deposition (ALD) process.

As can be seen from this view, the $2^{nd}$ mandrel spacer layer 282 has filled the $3^{rd}$ opening 192 to form a $3^{rd}$ cut plug 286. The $3^{rd}$ cut plug penetrates the entire depth of the aSi $2^{nd}$ mandrels 148.

Referring to FIG. 24, a perspective view of the structure 100 of FIG. 23 after the $2^{nd}$ mandrel spacer layer 282 has been anisotropically etched and the $2^{nd}$ mandrels 148 have been removed is presented. The SiO2 $2^{nd}$ mandrel spacer layer 282 is next anisotropically etched to form the $2^{nd}$ mandrel spacers 150 on sidewalls of the $2^{nd}$ mandrels 148. Then the $2^{nd}$ mandrels 148 are removed or stripped utilizing anyone of several well-known processes, such as a wet etching process, a RIE process or similar.

As can be seen from FIG. 24, the $2^{nd}$ mandrel spacers 150 have their $2^{nd}$ spacer width 178 (best seen in FIG. 2). The $2^{nd}$ spacer width 178 is equal to and defined by the $2^{nd}$ mandrel spacer layer thickness 284.

Importantly, the $2^{nd}$ mandrel spacers 150 and the $3^{rd}$ cut plugs 286 collectively form a $2^{nd}$ pattern portion 288. As will be discussed in greater detail herein, the $2^{nd}$ pattern portion 288 and the $1^{st}$ pattern portion 240 will be combined to form a final pattern 298 (best seen in FIG. 29) which will be utilized to form the signal lines A, B, C, power lines D and continuity cuts 134, 136, 138, 140 of the cells 102.

Referring to FIG. 25, the SiN $6^{th}$ hardmask layer 258 is anisotropically etched to transfer the $2^{nd}$ pattern portion 288 into the $6^{th}$ hardmask layer. This can be done by a RIE process or similar.

Note that the $4^{th}$ hardmask layer 254 is a SOH layer that is self planarizing. The self planarizing feature of the $4^{th}$ hardmask layer 254 provides a smooth surface upon which the $5^{th}$ hardmask layer 256 is disposed. The smooth surface of the $4^{th}$ (or SOH) layer 254 allows the etching of the SiN $6^{th}$ hardmask layer 258 to stop at the SiO2 $5^{th}$ hardmask layer 256 without gauging into the SOH layer 254.

Referring to FIG. 26, both the SiO2 spacers 150 and the SiO2 $5^{th}$ hardmask layer 256 are anisotropically etched to transfer the $2^{nd}$ pattern portion 288 into the $5^{th}$ hardmask layer 256. This can also be done by a RIE process or similar.

The $2^{nd}$ pattern portion 288 includes a plurality of pairs of $1^{st}$ line spacer molds 290 and $4^{th}$ line spacer molds 292 which were formed from the 2$^{nd}$ mandrel spacers 150. The 1$^{st}$ and 4$^{th}$ line spacer molds 290, 292 extend longitudinally in the Y direction. The 1$^{st}$ and 4$^{th}$ line spacer molds 290, 292 define the locations of the 1$^{st}$ and 4$^{th}$ line spacers 118, 124 that will be patterned into the dielectric layer 104. Additionally, a D line space 294 between the line spacer molds 290, 290 provides the location of the D power line which will also be patterned into the dielectric layer 104 later in the process flow.

The 2$^{nd}$ pattern portion 288 also includes a plurality of D cut mask sections 296, formed from the 3$^{rd}$ cut plugs 286, which extend between the line spacer molds 290, 292 in the X direction. The D cut mask sections 296 span the D line space 294 to define the locations of the third type continuity cuts 140 in the D power line.

Referring to FIG. 27, the SOH (4$^{th}$ hardmask) layer 254 is anisotropically etched to transfer the 2$^{nd}$ pattern portion 288 down to the TiN 1$^{st}$ hardmaks layer 194. At this point, the 1$^{st}$ and 2$^{nd}$ pattern portions 240, 288 are combined over the 1$^{st}$ hardmask layer 194 to form a final pattern 298.

Referring to FIG. 28, the remnants of the SiN 6$^{th}$ hardmask layer 258 and SiO2 5$^{th}$ hardmask layer 256 are removed through well-known processes. Additionally, the TiN 1$^{st}$ hardmask layer 194 is anisotropically etched to transfer the final pattern 298 down to the dielectric layer 104.

Referring to FIG. 29, the remnants of the SOH (4$^{th}$ hardmask) layer 254 and aSi 2$^{nd}$ hardmask layer 196 are removed through well known processes. The TiN pattern 298 now is disposed directly over the dielectric layer 104.

Referring to FIG. 30, the dielectric layer 104 is next anisotropically etched from the pattern 298 to form a series of A trenches 300, B trenches 302, C trenches 304 and D trenches 306. This can be done by an RIE process of similar. The A, B, C and D trenches will be used to form the A, B, C and D metal lines during subsequent metallization as is well known.

Additionally, the A cut mask sections 248 are used to form the A continuity cuts 134, the B cut mask sections 246 are used to form the B continuity cuts 136, the C cut mask sections 250 are used to form the C continuity cuts 138 and the D cut mask sections 296 are used to form the D continuity cuts 140.

Finally, the over extensions of the A and C cut mask sections 248, 250 form the notches 142 in the D lines.

Referring to FIG. 31, a perspective view of FIG. 30 after structure 100 has been metalized is presented. It is important to note that FIG. 31 is also a perspective view of FIGS. 1A and 1B.

Next during the process flow, the structure 100 is metalized. That is, a metal layer 308 is next disposed over structure 100 to fill the trenches 300, 302, 304, 306. This can be done by PVD, CVD or electroless metal plating or similar. The metal layer 308 may be composed of tungsten, copper, cobalt, ruthenium or similar.

The metal layer 308 is next planarized down to finalize the formation of the cells 102 into the dielectric layer 104 of the structure 100. This may be done by chemical mechanical polishing or similar.

As can be seen, the cells 102 now includes the fully formed signal metal lines A, B and C. Additionally, each cell 102 includes one power line D. The metal lines A, B, C and D are separated by fully formed line spacers 118, 120, 122 and 124. As discussed in FIGS. 1A, 1B, 2 and 3 the lines spacers 118, 120, 122 and 124 are substantially equal in width to each other and to the minimum spacer width 158. Advantageously, the line spacers are not subject to lithographic variation.

Also, the metal signal lines A, B and C are set substantially equal in width to each other and to the minimum line width 154. The power line D width 116 is set to be substantially equal to two signal line widths plus one line spacer width. Advantageously, the widths of the metal lines A, B, C and D may vary depending on performance specifications as long as they take into consideration worst case lithographic variation.

However, no matter what the variations of the metal line widths, the widths of the line spacers will not be affected by them. Therefore, the cell structure may be scaled down to minimum pitches of 36 nm, 32 nm, 28 nm, 26 nm or less and still be able to prevent inadvertent electrical shorting between lines.

Additionally, the cells 102 include the continuity cuts 134, 136, 138 and 140 in the A, B, C and D lines respectively. The B and D cuts are fully self aligned and not subject lithographic tolerances. The A and C cuts are self aligned on the side furthest from the power line D, but non-self aligned on the side adjacent the power line D. For that reason, a plurality of notches 142 are formed in the power lines D directly across in the X direction from cuts A and C. However, due to the larger size of power line D relative to the signal lines A, B, C, the notches 142 do not span across the width 116 of line D significantly enough to degrade performance. Typically the notches 142 will span 20 percent or less of the width 116 of power line D.

Although the invention has been described by reference to specific embodiments, it should be understood that numerous changes may be made within the spirit and scope of the inventive concepts described. Accordingly, it is intended that the invention not be limited to the described embodiments, but that it have the full scope defined by the language of the following claims.

What is claimed is:

1. A semiconductor cell comprising:
a dielectric layer composed of a dielectric isolation material;
an array of substantially parallel metal lines disposed in a longitudinal direction within the dielectric layer, the metal lines having line widths that are substantially equal to or greater than a predetermined minimum line width;
line spacers disposed between the metal lines and having the dielectric isolation material of the dielectric layer disposed therein, the line spacers having line spacer widths that are substantially equal to or greater than a predetermined minimum line spacer width adequate to provide electrical isolation between the metal lines; and
an overall cell height being substantially equal to a multiple of a plurality of cell tracks, each cell track being a minimum pitch of the cell, the minimum pitch defined by the minimum line width plus the minimum line spacer width;
wherein the minimum pitch is equal to or less than one of 32 nm pitch, 28 nm pitch and 26 nm pitch; and
wherein the array of metal lines includes:
a signal line having a continuity cut disposed across its entire line width, and
a power line adjacent the signal line, the power line having a line width that is greater than twice the minimum line width, the power line having a notch disposed partially across its line width, the notch being aligned with the continuity cut in a direction substantially perpendicular to the longitudinal direction of the metal lines.

2. The semiconductor cell of claim 1 wherein the notch is disposed across 20 percent or less of the entire line width of the power line.

3. The semiconductor cell of claim 1 wherein the line width of the power line is substantially equal to or greater than twice the minimum line width plus a minimum line spacer width.

4. The semiconductor cell of claim 1 comprising a plurality of semiconductor cells, the plurality of semiconductor cells including:
   arrays of metal lines having line widths that are not all substantially equal;
   a first pair of line spacers having first line spacer widths that are substantially equal; and
   a second pair of line spacers adjacent to the first pair of line spacers, the second pair of line spacers having second line spacer widths that are substantially equal, the second line spacer widths not being equal to the first line spacer widths.

5. The semiconductor cell of claim 4 wherein the first and second pair of line spacers alternate continuously from cell to cell along the plurality of semiconductor cells.

6. The semiconductor cell of claim 1 wherein:
   not all of the line widths are substantially equal; and
   all of the line spacer widths are substantially equal.

7. The semiconductor cell of claim 6 wherein the line spacer widths are equal to within plus or minus 2 nanometers.

8. The semiconductor cell of claim 1 comprising:
   a plurality of signal lines and at least one power line; and
   at least one of a first type cut, second type cut and third type cut disposed across the line widths of the lines, wherein:
      the first type cut is disposed across signal lines that are not adjacent a power line,
      the second type cut is disposed across signal lines that are adjacent a power line, and
      the third type cut is disposed across a power line.

* * * * *